US010917065B2

(12) United States Patent
Mongin et al.

(10) Patent No.: US 10,917,065 B2
(45) Date of Patent: *Feb. 9, 2021

(54) RF HEATING SYSTEM WITH PHASE DETECTION FOR IMPEDANCE NETWORK TUNING

(71) Applicant: NXP USA, Inc., Austin, TX (US)

(72) Inventors: Lionel Mongin, Chandler, AZ (US); Pierre Marie Jean Piel, Chandler, AZ (US); James Eric Scott, Gilbert, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/917,035

(22) Filed: Jun. 30, 2020

(65) Prior Publication Data

US 2020/0336124 A1 Oct. 22, 2020

Related U.S. Application Data

(62) Division of application No. 15/816,802, filed on Nov. 17, 2017.

(51) Int. Cl.
*H03H 7/40* (2006.01)
*H05B 6/50* (2006.01)
(Continued)

(52) U.S. Cl.
CPC ............... *H03H 7/40* (2013.01); *H05B 6/50* (2013.01); *H05B 6/54* (2013.01); *H05B 6/705* (2013.01)

(58) Field of Classification Search
CPC ... H03H 7/40; H05B 6/50; H05B 6/54; H05B 6/705
See application file for complete search history.

(56) References Cited

U.S. PATENT DOCUMENTS

| 4,980,530 A | 12/1990 | Butot |
| 5,585,766 A | 12/1996 | Shel |

(Continued)

FOREIGN PATENT DOCUMENTS

| CN | 1823683 A | 8/2006 |
| CN | 104782226 A | 7/2015 |

(Continued)

OTHER PUBLICATIONS

Final Office Action; U.S. Appl. No. 15/456,398; 28 pages (dated Jul. 22, 2020).

(Continued)

*Primary Examiner* — Samuel S Outten

(57) ABSTRACT

A system and method for tuning an impedance network of a device is provided. An RF signal is provided through a transmission path connected to an impedance matching network that includes a first variable component and a second variable component. A phase angle between a forward signal and a reflected signal along the transmission path is determined. Based on the phase angle between the forward signal and the reflected signal, the first variable component is modified to improve an impedance match between the RF signal source and the electrode. After modifying the first variable component, a ratio of a power of the reflected signal to a power of the forward signal is determined, and an inductance of the second variable component is modified to reduce the ratio of a power of the reflected signal to a power of the forward signal.

16 Claims, 9 Drawing Sheets

(51) Int. Cl.
*H05B 6/54* (2006.01)
*H05B 6/70* (2006.01)

(56) References Cited

U.S. PATENT DOCUMENTS

| | | | |
|---|---|---|---|
| 6,252,354 B1 * | 6/2001 | Collins | H01J 37/321 |
| | | | 315/111.51 |
| 9,967,925 B2 | 5/2018 | Brill | |
| 10,124,187 B2 | 11/2018 | Schwarz et al. | |
| 2002/0003141 A1 | 1/2002 | Blaker et al. | |
| 2003/0205571 A1 | 11/2003 | Flugstad et al. | |
| 2008/0264800 A1 | 10/2008 | Schlager et al. | |
| 2009/0194526 A1 | 8/2009 | Buchanan | |
| 2010/0141042 A1 | 6/2010 | Kesler et al. | |
| 2010/0239757 A1 | 9/2010 | Murata | |
| 2010/0247403 A1 | 9/2010 | Hancock | |
| 2011/0176911 A1 | 7/2011 | Couturier et al. | |
| 2011/0278284 A1 | 11/2011 | Tian et al. | |
| 2012/0119842 A1 | 5/2012 | Gu et al. | |
| 2012/0164022 A1 | 6/2012 | Muginstein et al. | |
| 2013/0119055 A1 | 11/2013 | Wohl et al. | |
| 2015/0091441 A1 | 4/2015 | Marakhtanov et al. | |
| 2016/0248396 A1 * | 8/2016 | Mavretic | H01L 21/67115 |
| 2017/0096352 A1 | 4/2017 | Hughes et al. | |
| 2017/0266986 A1 | 9/2017 | Yamada | |
| 2017/0302236 A1 | 10/2017 | Oshita | |
| 2018/0062605 A1 | 3/2018 | Brounley et al. | |
| 2018/0115298 A1 * | 4/2018 | Fujimoto | H03H 7/40 |
| 2019/0320506 A1 | 10/2019 | Guatta et al. | |
| 2020/0136497 A1 | 4/2020 | Beck | |

FOREIGN PATENT DOCUMENTS

| | | |
|---|---|---|
| CN | 104930804 A | 9/2015 |
| CN | 105142253 A | 12/2015 |
| CN | 105357788 A | 2/2016 |
| CN | 105768922 A | 7/2016 |
| CN | 106225029 A | 12/2016 |
| CN | 106301362 A | 1/2017 |
| CN | 205860137 U | 1/2017 |
| CN | 205919380 U | 2/2017 |
| CN | 206213147 U | 6/2017 |
| CN | 107359705 A | 11/2017 |
| CN | 107373296 A | 11/2017 |
| CN | 206724547 U | 12/2017 |
| EP | 1 577 281 A1 | 9/2005 |
| GB | 621320 | 4/1949 |
| JP | 55-44199 | 3/1980 |
| JP | 63-207921 | 8/1988 |
| JP | H06215955 A | 8/1994 |
| JP | 2012207900 A | 10/2012 |
| KR | 100133085 | 4/1998 |
| WO | 2014/006510 A2 | 1/2014 |
| WO | 2015/028839 A1 | 3/2015 |

OTHER PUBLICATIONS

Notice of Allowance; U.S. Appl. No. 15/806,075; 10 pages (dated Oct. 5, 2020).
Notice of Allowance; U.S. App. No. 15/843,290; 7 pages (dated Jul. 31, 2020).
Non Final Office Action; U.S. Appl. No. 16/126,963; 15 pages (dated Jul. 28, 2020).
Non Final Office Action; U.S. Appl. No. 15/923,455; 20 pages (dated Oct. 29, 2020).

* cited by examiner

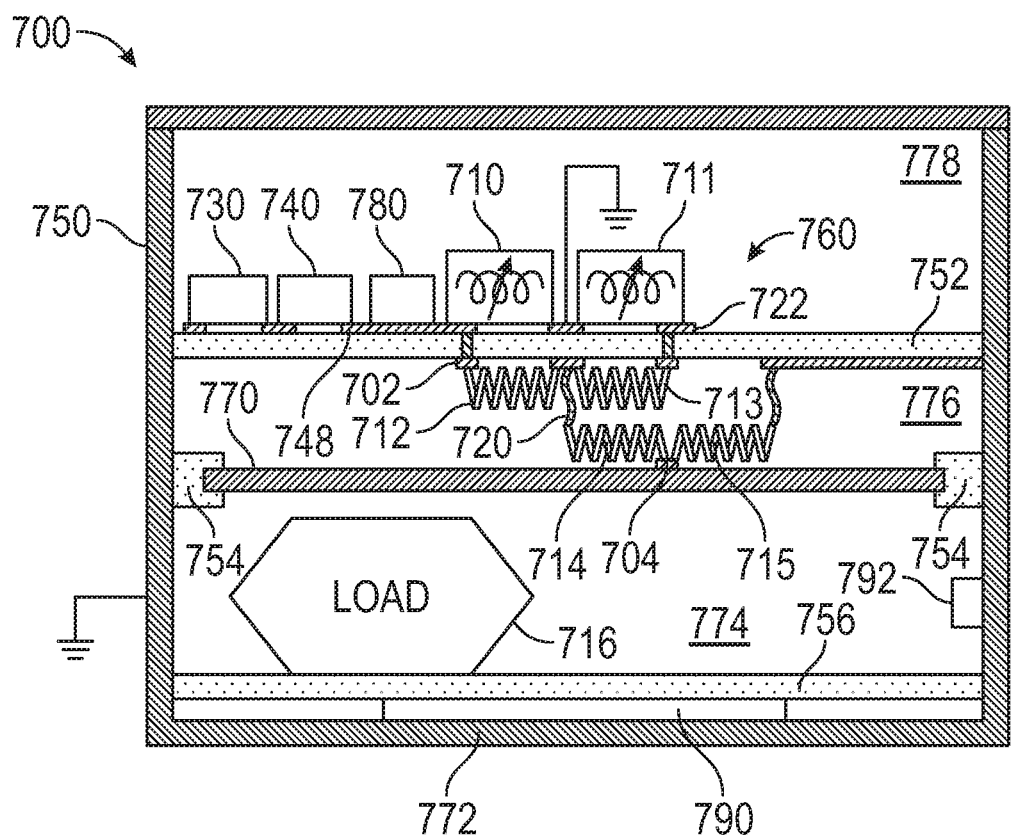
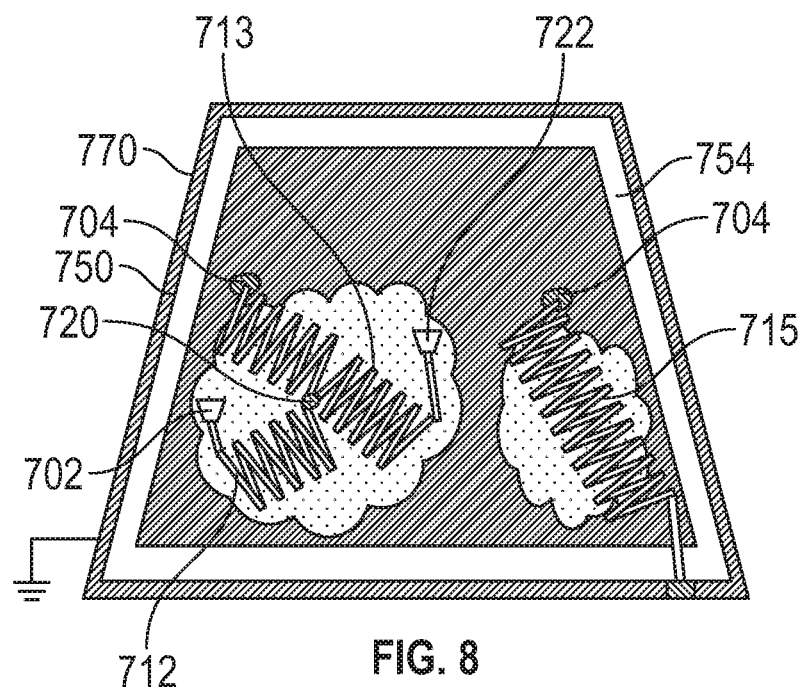

RF HEATING SYSTEM WITH PHASE DETECTION FOR IMPEDANCE NETWORK TUNING

CROSS-REFERENCE TO RELATED APPLICATION

This application is a divisional of co-pending, U.S. patent application Ser. No. 15/816,802, filed on Nov. 17, 2017.

TECHNICAL FIELD

Embodiments of the subject matter described herein relate generally to an apparatus and method of tuning a load impedance for delivering radio frequency (RF) energy to a load.

BACKGROUND

Capacitive food heating systems include large planar electrodes contained within a heating compartment. After a food load is placed between the electrodes, electromagnetic energy is supplied to the electrodes to provide warming of the food load. As the food load thaws or cooks during the heating operation, the impedance of the food load changes. The dynamic changes to the food load impedance may result in inefficient heating of the food load. What are needed are apparatus and methods for heating food loads (or other types of loads) that may result in efficient and even heating throughout the food load.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 7 is a cross-sectional, side view of a defrosting system, in accordance with an example embodiment;

FIG. 8 is a perspective view of a portion of a defrosting system, in accordance with an example embodiment;

DETAILED DESCRIPTION

Figure 1:
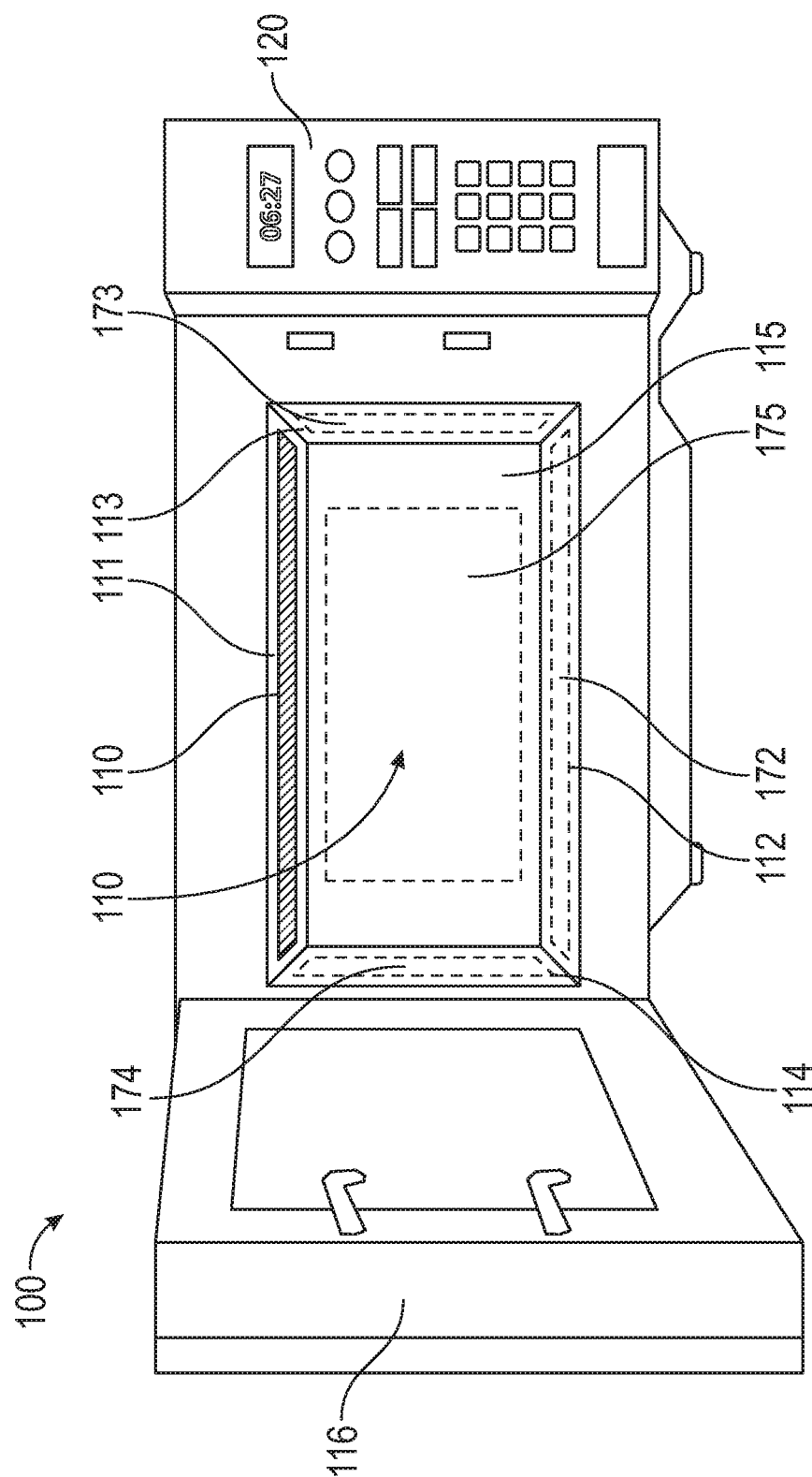
FIG. 1 is a perspective view of a heating appliance, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

"As used herein, the terms "heat," "heating," and the like mean to increase the thermal energy of a load. A heating operation may include a defrosting operation, a cooking operation, or any other operation that increases the thermal energy of a load. Embodiments of the subject matter described herein relate to solid-state heating devices that may be incorporated into stand-alone appliances or into other systems. As described in greater detail below, exemplary heating systems can be realized using a first electrode disposed in a cavity, an amplifier arrangement (possibly including one or more transistors), an impedance matching network coupled between an output of the amplifier arrangement and the first electrode, and a measurement and control system that can modify the heating operation by adjusting an attribute of the impedance matching network. As such, the impedance matching network is a variable impedance matching network that can be adjusted during the heating operation to improve matching between the amplifier arrangement and the cavity. An improved matching provided by such a variable impedance matching network enables more efficient transfer between a signal source and an output. Specifically, by improving matching, the variable impedance matching network can operate to reduce a magnitude of a reflected signal back to the device's signal source and maximize power transfer into an output node connected to the impedance matching network.

In various implementations, impedance matching networks may have a relatively large number of potential impedance states. That is, the impedance matching networks can exhibit a large number of different impedances between an input to the impedance matching network and the network's output. The different impedance states may be selected, for example, by supplying the impedance matching network with different control inputs (e.g., supplied by a system controller), which are selected to configure the state of one or more internal components of the impedance matching network. With the states of those internal components so configured, the impedance of the impedance matching network can be controlled.

In a heating system, the impedance of the impedance matching network is configured to provide an optimum RF power delivery into the load in the heating system. This generally involves selecting an impedance value for the impedance matching network that minimizes or reduces and amount of reflected energy within the heating cavity of the heating system. By reducing an amount of reflected energy within the heating cavity, this approach can maximize or increase an amount of RF energy that is being delivered into a load positioned within the heating cavity.

Some variable impedance matching networks may be configurable into a large number of states, each state exhibiting a different impedance value or providing a different impedance transformation between an input and an output to the network. Some networks, for example, may have thousands (e.g., 2,048 or some other number) of possible impedance matching states, each exhibiting a different impedance value. When selecting an appropriate state of the impedance matching network that maximizes or increase RF energy transfer into the load (i.e., "tuning" the system), the amount of time that would be required to test each state of the variable impedance matching network to determine an optimal match could substantial. Consequently, to avoid undesirably long heating operations, the frequency of tuning operations that call for testing every state of the variable impedance matching network—that is, the frequency with which the impedance of the impedance matching network is adjusted to generate an improved impedance match—may be performed less frequently than desired during heating operation. This can, in turn, lead to a less efficient heating operation. Essentially, using current methods, a tradeoff needs to be made between heating efficiency and heating duration.

A system and method is provided, therefore, that can enable an efficient tuning of a variable impedance matching network for an RF heating application. The approach involves supplying an incident RF test signal through the variable impedance matching network into the heating cavity of the heating system. The incident or forward RF test signal is transmitted into the heating cavity and a reflected RF signal is generated within the heating cavity. The forward and reflected RF signals are detected by a power detection system. A difference in the phase angles between the forward RF test signal and the reflected RF test signal is calculated. Based upon the difference in phase angles, a first tuning element in the variable impedance matching network is tuned to adjust the amount of effective series inductance introduced by the impedance matching network. This, in turn, enables a second adjustment of a shunt inductance to optimize a match of the variable impedance matching network so that the impedance of the impedance matching network is matched to the heating system's load (i.e., the heating cavity plus a load within the cavity). Said another way, the phase of the load reflection coefficient is measured, and an amount of shunt inductance needed to transform the load to a point where a series inductance may be used to match the load is computed. An embodiment of a unique searching algorithm significantly reduces the number of tested system states to more quickly determine an acceptable impedance matching system state. In other words, given knowledge of the complex impedance, appropriate tuning parameters can be rapidly identified as a load changes impedance during heating.

FIG. 1 is a perspective view of heating system 100, in accordance with an example embodiment. Heating system 100 includes a cavity 110, a control panel 120, one or more radio frequency (RF) signal sources (e.g., RF signal source 340, FIG. 3), a power supply (e.g., power supply 350, FIG. 3), a first electrode 170, power detection circuitry (e.g., power detection circuitry 380, FIG. 3), and a system controller (e.g., system controller 330, FIG. 3). The heating cavity 110 is defined by interior surfaces of top, bottom, side, and back cavity walls 111, 112, 113, 114, 115 and an interior surface of door 116. With door 116 closed, heating cavity 110 defines an enclosed air cavity. As used herein, the term "air cavity" may mean an enclosed area that contains air or other gasses (e.g., heating cavity 110).

According to an embodiment, first electrode 170 is arranged proximate to a cavity wall (e.g., top wall 111), first electrode 170 is electrically isolated from the remaining cavity walls (e.g., walls 112-115 and door 116), and the remaining cavity walls are grounded. In such a configuration, the system may be simplistically modeled as a capacitor, where first electrode 170 functions as one conductive plate, the grounded cavity walls (e.g., walls 112-115) function as a second conductive plate (or electrode), and the air cavity (including any load contained therein) function as a dielectric medium between the first and second conductive plates. Although not shown in FIG. 1, a non-electrically conductive barrier (e.g., barrier 314, FIG. 3) also may be included in the system 100, and the non-conductive barrier may function to electrically and physically isolate the load from the bottom cavity wall 112. Although FIG. 1 shows first electrode 170 being proximate to top wall 111, first electrode 170 alternatively may be proximate to any of the other walls 112-115, as indicated by alternate electrodes 172-175.

According to an embodiment, during operation of heating system 100, a user (not illustrated) may place one or more loads (e.g., food and/or liquids) into heating cavity 110, and optionally may provide inputs via control panel 120 that specify characteristics of the load(s). For example, the specified characteristics may include an approximate weight of the load. In addition, the specified load characteristics may indicate the material(s) from which the load is formed (e.g., meat, bread, liquid). In alternate embodiments, the load characteristics may be obtained in some other way, such as by scanning a barcode on the load packaging or receiving a radio frequency identification (RFID) signal from an RFID tag on or embedded within the load. Either way, as will be described in more detail later, information regarding such load characteristics can enable the system controller (e.g., system controller 330, FIG. 3) to establish an initial state for the impedance matching network of the system at the beginning of the heating operation, where the initial state may be relatively close to an optimal state that enables maximum RF power transfer into the load. Alternatively, load characteristics may not be entered or received prior to commencement of a heating operation, and the system controller may establish a default initial state for the impedance matching network.

To begin the heating operation, the user may provide an input via control panel 120. In response, the system controller causes the RF signal source(s) (e.g., RF signal source 340, FIG. 3) to supply an RF signal to first electrode 170, which responsively radiates electromagnetic energy into heating cavity 110. The electromagnetic energy increases the thermal energy of the load (i.e., the electromagnetic energy causes the load to warm up).

During the heating operation, the impedance of the load (and thus the total input impedance of heating cavity 110 plus load) changes as the thermal energy of the load increases. The impedance changes alter the absorption of RF energy into the load, and thus alter the magnitude of reflected power and can, over time, reduce the efficiency of the heating operation. According to an embodiment, power detection circuitry (e.g., power detection circuitry 380, FIG. 3) continuously or periodically measures the forward and reflected power along a transmission path (e.g., transmission path 348, FIG. 3) between the RF signal source (e.g., RF signal source 340, FIG. 3) and first electrode 170. Based on these measurements, the system controller (e.g., system controller 330, FIG. 3) may execute algorithms to alter the state of the variable impedance matching network to provide for an optimum RF power delivery into the load. The variable impedance matching network may be tuned based on the forward and reflected power measurements.

Figure 2:
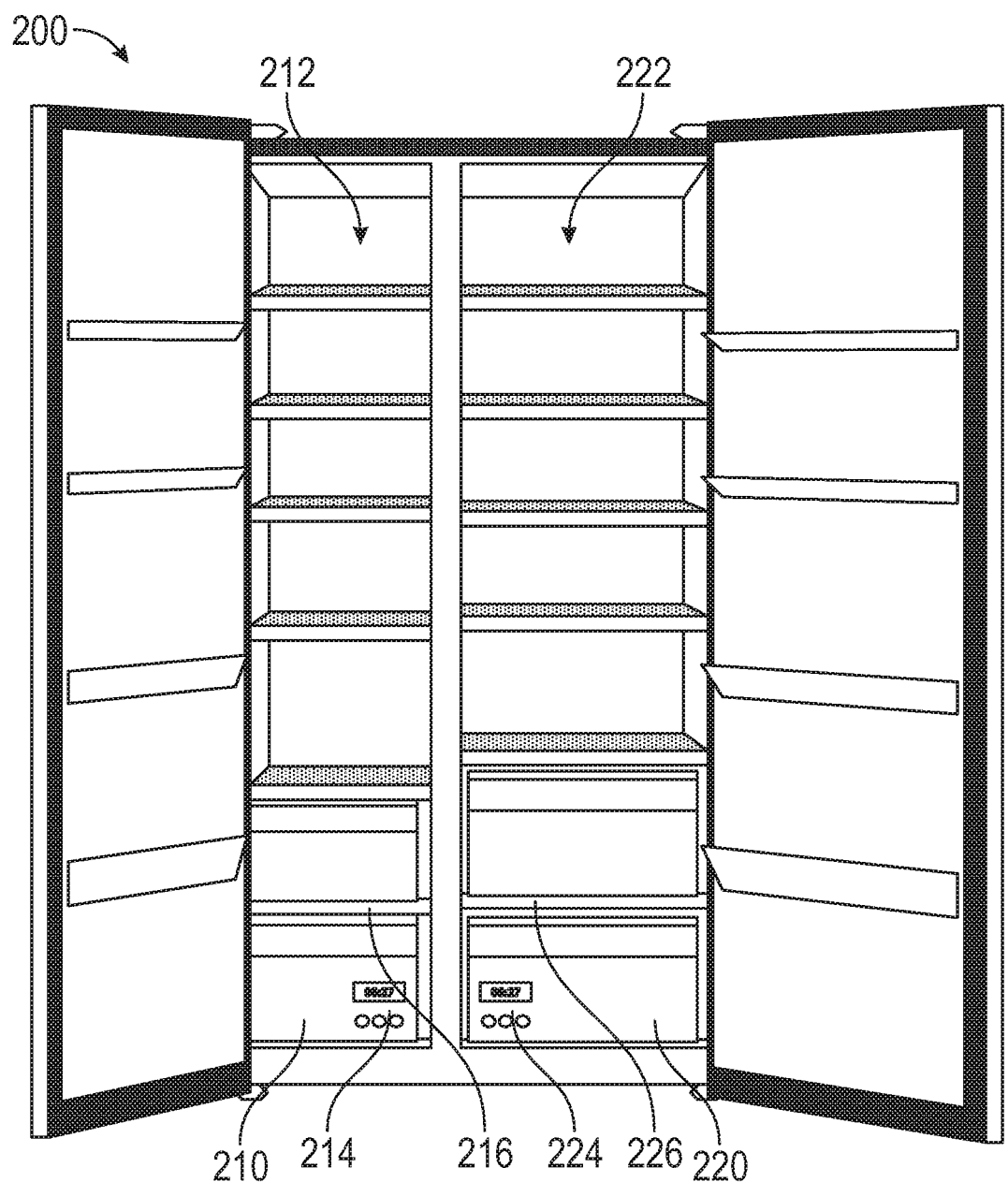
FIG. 2 is a perspective view of a refrigerator/freezer appliance that includes other example embodiments of heating systems.

Heating system 100 of FIG. 1 is embodied as a countertop type of appliance. In a further embodiment, heating system 100 also may include components and functionality for performing microwave cooking operations. Alternatively, components of a heating system may be incorporated into other types of systems or appliances. For example, FIG. 2 is a perspective view of a refrigerator/freezer appliance 200 that includes other example embodiments of heating systems 210, 220. More specifically, heating system 210 is shown to be incorporated within a freezer compartment 212 of the system 200 (in which case heating system 210 may be primarily used to defrost food), and heating system 220 is shown to be incorporated within a refrigerator compartment 222 of the system (in which case heating system 220 may be primarily used to defrost and/or cook food). An actual refrigerator/freezer appliance likely would include only one of heating systems 210, 220, but both are shown in FIG. 2 to concisely convey both embodiments.

Figure 3:
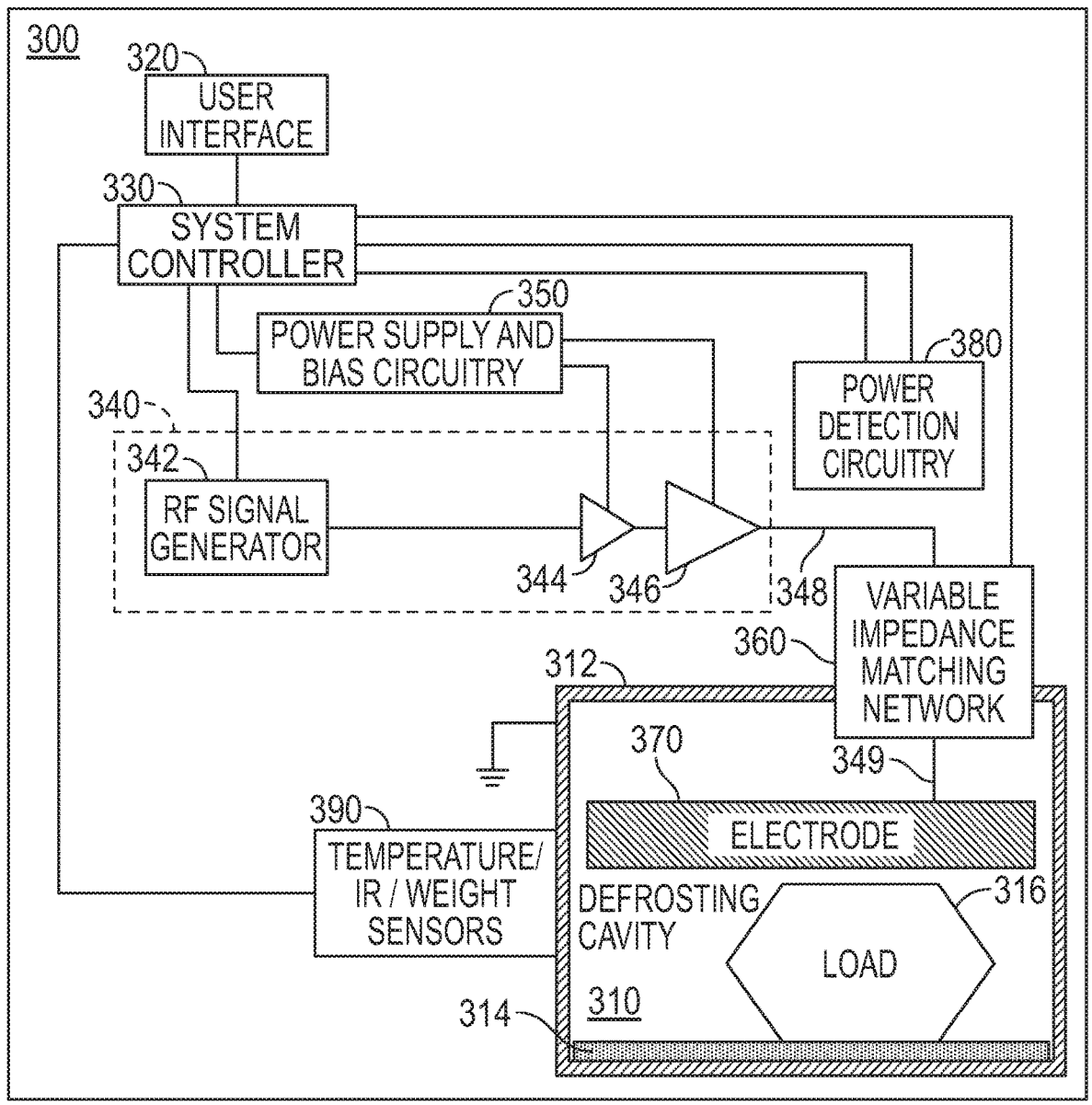
FIG. 3 is a simplified block diagram of a heating apparatus, in accordance with an example embodiment.

Similar to heating system 100, each of heating systems 210, 220 includes a heating cavity, a control panel 214, 224, one or more RF signal sources (e.g., RF signal source 340, FIG. 3), a power supply (e.g., power supply 350, FIG. 3), a first electrode (e.g., electrode 370, FIG. 3), power detection circuitry (e.g., power detection circuitry 380, FIG. 3), and a system controller (e.g., system controller 330, FIG. 3). For example, the heating cavity may be defined by interior surfaces of bottom, side, front, and back walls of a drawer, and an interior top surface of a fixed shelf 216, 226 under which the drawer slides. With the drawer slid fully under the shelf, the drawer and shelf define the cavity as an enclosed air cavity. The components and functionalities of heating systems 210, 220 may be substantially the same as the components and functionalities of heating system 100, in various embodiments.

In addition, according to an embodiment, upon completion of a heating operation by the freezer-based heating system 210, the cavity within which the load is contained may thermally communicate with freezer compartment 212, and if the load is not promptly removed from the cavity, the load may re-freeze. Similarly, upon completion of a heating operation by the refrigerator-based heating system 220, the cavity within which the defrosted load is contained may thermally communicate with the refrigerator compartment 222, and if the load is not promptly removed from the cavity, the load may be returned to the temperature within the refrigerator compartment 222.

Those of skill in the art would understand, based on the description herein, that embodiments of heating systems may be incorporated into systems or appliances having other configurations, as well. Accordingly, the above-described implementations of heating systems in a stand-alone appliance, a microwave oven appliance, a freezer, and a refrigerator are not meant to limit use of the embodiments only to those types of systems.

Although heating systems 100, 200 are shown with their components in particular relative orientations with respect to one another, it should be understood that the various components may be oriented differently, as well. In addition, the physical configurations of the various components may be different. For example, control panels 120, 214, 224 may have more, fewer, or different user interface elements, and/or the user interface elements may be differently arranged. In addition, although a substantially cubic heating cavity 110 is illustrated in FIG. 1, it should be understood that a heating cavity may have a different shape, in other embodiments (e.g., cylindrical, and so on). Further, heating systems 100, 210, 220 may include additional components (e.g., a fan, a stationary or rotating plate, a tray, an electrical cord, and so on) that are not specifically depicted in FIGS. 1, 2.

FIG. 3 is a simplified block diagram of heating system 300 in accordance with an example embodiment. Heating system 300 includes heating cavity 310, user interface 320, system controller 330, RF signal source 340, power supply and bias circuitry 350, variable impedance matching network 360, electrode 370, and power detection circuitry 380, in an embodiment. In addition, in other embodiments, heating system 300 may include temperature sensor(s), infrared (IR) sensor(s), and/or weight sensor(s) 390, although some or all of these sensor components may be excluded. It should be understood that FIG. 3 is a simplified representation of heating system 300 for purposes of explanation and ease of description, and that practical embodiments may include other devices and components to provide additional functions and features, and/or heating system 300 may be part of a larger electrical system or appliance.

User interface 320 may correspond to a control panel (e.g., control panel 120, 214, 224, FIGS. 1, 2), for example, which enables a user to provide inputs to the system regarding parameters for a heating operation (e.g., characteristics of the load to be heated, and so on), start and cancel buttons, mechanical controls (e.g., a door/drawer open latch), and so on. In addition, the user interface may be configured to provide user-perceptible outputs indicating the status of a heating operation (e.g., a countdown timer, visible indicia indicating progress or completion of the heating operation, and/or audible tones indicating completion of the heating operation) and other information.

System controller 330 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 330 is coupled to user interface 320, RF signal source 340, variable impedance matching network 360, power detection circuitry 380, and sensors 390 (if included). System controller 330 is configured to receive signals indicating user inputs received via user interface 320, and to receive forward and reflected power measurements from power detection circuitry 380. Responsive to the received signals and measurements, and as will be described in more detail later, system controller 330 provides control signals to the power supply and bias circuitry 350 and to the RF signal generator 342 of the RF signal source 340. In addition, system controller 330 provides control signals to the variable impedance matching network 360, which cause the network 360 to change its state or configuration.

Heating cavity 310 includes a capacitive heating arrangement with first and second parallel plate electrodes that are separated by an air cavity within which a load 316 to be heated may be placed. For example, first electrode 370 may be positioned above the air cavity, and a second electrode may be provided by a portion of containment structure 312. More specifically, the containment structure 312 may include bottom, top, and side walls, the interior surfaces of which define heating cavity 310 (e.g., heating cavity 110, FIG. 1). According to an embodiment, heating cavity 310 may be sealed (e.g., with door 116, FIG. 1 or by sliding a drawer closed under a shelf 216, 226, FIG. 2) to contain the electromagnetic energy that is introduced into heating cavity 310 during a heating operation. Heating system 300 may include one or more interlock mechanisms that ensure that the seal is intact during a heating operation. If one or more of the interlock mechanisms indicates that the seal is breached, system controller 330 may cease the heating operation. According to an embodiment, containment structure 312 is at least partially formed from conductive material, and the conductive portion(s) of containment structure 312 may be grounded. Alternatively, at least the portion of containment structure 312 that corresponds to the bottom surface of heating cavity 310 may be formed from conductive material and grounded. Either way, containment structure 312 (or at least the portion of containment structure 312 that is parallel with the first electrode 370) functions as a second electrode of the capacitive heating arrangement. To avoid direct contact between load 316 and the grounded bottom surface of heating cavity 310, a non-conductive barrier 314 may be positioned over the bottom surface of heating cavity 310.

First electrode 370 is electrically coupled to RF signal source 340 through variable impedance matching network 360 and transmission path 348, in an embodiment. Variable impedance matching circuit 360 is configured to perform an impedance transformation from an impedance of RF signal source 340 to an input impedance of heating cavity 340 as modified by load 316. In an embodiment, variable impedance matching network 360 includes a network of passive components (e.g., inductors, capacitors, resistors). According to a more specific embodiment, variable impedance matching network 360 includes a plurality of fixed-value fixed-value inductors that are positioned within heating cavity 310 and which are electrically coupled to first electrode 370. In addition, variable impedance matching network 360 includes a plurality of variable inductance networks, which may be located inside or outside of heating cavity 310. The inductance value provided by each of the variable inductance networks is established using control signals from system controller 330, as described herein.

Heating cavity 310 and load 316 (e.g., food, liquids, and so on) positioned in the heating cavity 310 present a cumulative load for the electromagnetic energy (or RF power) that is radiated into heating cavity 310 by first electrode 370. More specifically, heating cavity 310 and load 316 present an impedance to the system, referred to herein as a "cavity input impedance." The cavity input impedance changes during a heating operation as the temperature and state of load 316 increases. As the cavity input impedance changes, the efficiency of the heating operation—and, specifically, the amount of RF energy being delivered into the food load—changes. As such, based on reflected and forward power measurements from power detection circuitry 380, system controller 330 is configured to adjust the state of impedance matching network 360 to provide that RF energy is efficiently delivered into the food load. Accordingly, the amount of RF power that is absorbed by load 316 may be maintained at a high level despite variations in the load impedance during the heating operation.

According to an embodiment, RF signal source 350 includes an RF signal generator 342 and a power amplifier (e.g., including one or more power amplifier stages 344, 346). In response to control signals provided by system controller 330, RF signal generator 342 is configured to produce an oscillating electrical signal having a frequency in the ISM (industrial, scientific, and medical) band, although the system could be modified to support operations in other frequency bands, as well. RF signal generator 342 may be controlled to produce oscillating signals of different power levels and/or different frequencies, in various embodiments. For example, RF signal generator 342 may produce a signal that oscillates in a range of about 1.0 megahertz (MHz) to about 500 MHz. Some desirable frequencies may be, for example, 13.56 MHz (+/−5 percent), 27.125 MHz (+/−5 percent), and 40.68 MHz (+/−5 percent). In one particular embodiment, for example, RF signal generator 342 may produce a signal that oscillates in a range of about 40.66 MHz to about 40.70 MHz and at a power level in a range of about 10 decibels (dB) to about 15 dB. Alternatively, the frequency of oscillation and/or the power level may be lower or higher.

In the embodiment of FIG. 3, the power amplifier includes driver amplifier stage 344 and final amplifier stage 346. The power amplifier is configured to receive the oscillating signal from RF signal generator 342, and to amplify the signal to produce a significantly higher-power signal at an output of the power amplifier. For example, the output signal may have a power level in a range of about 100 Watts to about 400 Watts, 1,000 Watts or more. The gain applied by the power amplifier may be controlled using gate bias voltages and/or drain supply voltages provided by the power supply and bias circuitry 350 to each amplifier stage 344, 346. More specifically, power supply and bias circuitry 350 provides bias and supply voltages to each RF amplifier stage 344, 346 in accordance with control signals received from system controller 330.

In an embodiment, each amplifier stage 344, 346 is implemented as a power transistor, such as a field effect transistor (FET), having an input terminal (e.g., a gate or control terminal) and two current carrying terminals (e.g., source and drain terminals). Impedance matching circuits (not illustrated) may be coupled to the input (e.g., gate) of driver amplifier stage 344, between the driver and final amplifier stages 346, and/or to the output (e.g., drain terminal) of final amplifier stage 346, in various embodiments. In an embodiment, each transistor of amplifier stages 344, 346 includes a laterally diffused metal oxide semiconductor FET (LDMOSFET) transistor. However, it should be noted that the transistors are not intended to be limited to any particular semiconductor technology, and in other embodiments, each transistor may be realized as a high electron mobility transistor (HFET) (e.g., a gallium nitride (GaN) transistor), another type of MOSFET transistor, a bipolar junction transistor (BJT), or a transistor utilizing another semiconductor technology.

In FIG. 3, the power amplifier arrangement is depicted to include two amplifier stages 344, 346 coupled in a particular manner to other circuit components. In other embodiments, the power amplifier arrangement may include other amplifier topologies and/or the amplifier arrangement may include only one amplifier stage, or more than two amplifier stages. For example, the power amplifier arrangement may include various embodiments of a single ended amplifier, a double ended amplifier, a push-pull amplifier, a Doherty amplifier, a Switch Mode Power Amplifier (SMPA), or another type of amplifier.

Power detection circuitry 380 is coupled along transmission path 348 between the output of RF signal source 340 and the input to variable impedance matching network 360, in an embodiment. In an alternate embodiment, power detection circuitry 380 may be coupled to transmission path 349 between the output of variable impedance matching network 360 and first electrode 370. Either way, power detection circuitry 380 is configured to monitor, measure, or otherwise detect the power of the forward signals (i.e., from RF signal source 340 toward first electrode 370) and the reflected signals (i.e., from first electrode 370 toward RF signal source 340) traveling along transmission path 348. Power detection circuitry 380 may further be configured to detect the phases of the forward and reflected signals, which enables a determination of a phase angle between the forward and reflected signals.

Power detection circuitry 380 supplies signals conveying the magnitudes and phase angles of the forward and reflected signal power to system controller 330. System controller 330, in turn, may calculate a ratio of reflected signal power to forward signal power, or the S11 parameter, as well as a phase angle between the forward and reflected signals. As will be described in more detail below, when the phase angle between the forward and reflected signals is not equal to (or within a threshold value of) a target phase angle for the heating system, that may indicate that heating system 300 is not adequately matched. Similarly, when the reflected to forward power ratio exceeds a threshold, that may also indicate that heating system 300 is not adequately matched, and that energy absorption by load 316 may be sub-optimal. In such a situation, system controller 330 orchestrates a process of altering the state of the variable impedance matching network, thus re-establishing an acceptable match and facilitating more optimal energy transfer into load 316.

As mentioned above, some embodiments of heating system 300 may include temperature sensor(s), IR sensor(s), and/or weight sensor(s) 390. The temperature sensor(s) and/or IR sensor(s) may be positioned in locations that enable the temperature of load 316 to be sensed during the heating operation. When provided to system controller 330, the temperature information enables system controller 330 to alter the power of the RF signal supplied by RF signal source 340 (e.g., by controlling the bias and/or supply voltages provided by the power supply and bias circuitry 350), to adjust the state of the variable impedance matching network 360, and/or to determine when the heating operation should be terminated. The weight sensor(s) are positioned under load 316, and are configured to provide an estimate of the weight of load 316 to system controller 330. System controller 330 may use this information, for example, to determine a desired power level for the RF signal supplied by RF signal source 340, to determine an initial setting for variable impedance matching network 360, and/or to determine an approximate duration for the heating operation.

As discussed above, variable impedance matching network 360 is used to match the input impedance of heating cavity 310 plus load 316 to maximize, to the extent possible, the RF power transfer into load 316. The initial impedance of heating cavity 310 and load 316 may not be known with accuracy at the beginning of a heating operation. Further, the impedance of load 316 changes during a heating operation as load 316 warms up. According to an embodiment, system controller 330 may provide control signals to variable impedance matching network 360, which cause modifications to the state of variable impedance matching network 360. This enables system controller 330 to establish an initial state of variable impedance matching network 360 at the beginning of the heating operation (e.g., an initial state that has a relatively low reflected to forward power ratio, and thus a relatively high absorption of the RF power by load 316). In addition, this enables system controller 330 to modify the state of variable impedance matching network 360 so that an adequate match may be maintained throughout the heating operation, despite changes in the impedance of the load 316.

According to an embodiment, variable impedance matching network 360 may include a network of passive components, and more specifically a network of fixed-value inductors (e.g., fixed-value inductive components) and variable inductors (or variable inductance networks) in several embodiments. As used herein, the term "inductor" means a discrete inductor or a set of inductive components that are electrically coupled together without intervening components of other types (e.g., resistors or capacitors). As used herein, a "network" is a circuit that can include one or a plurality of passive and active electrical components. In some embodiments, the "variable impedance matching network" is a circuit that includes at least one passive component (e.g., including inductances, capacitances, resistances, and/or a combination thereof) and possibly one or more active components (e.g., transistors). Similarly, a "variable inductance network" is a circuit that includes at least one inductance, and may include one or more other passive and/or active components (e.g., capacitances, resistances, transistors).

Figure 4:
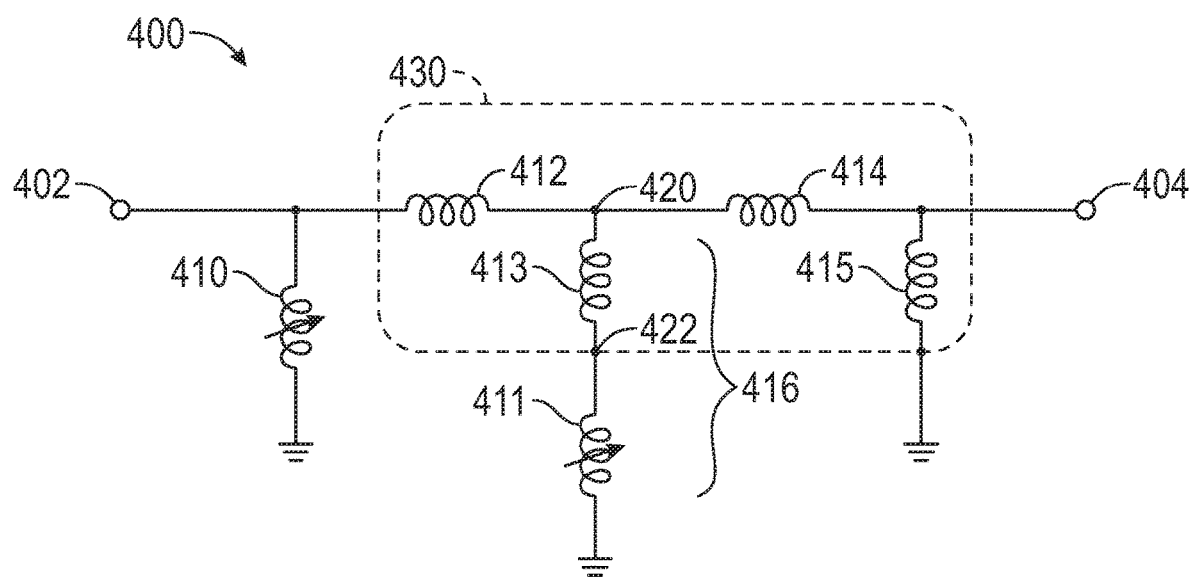
FIG. 4 is a schematic diagram of a variable inductance matching network, in accordance with an example embodiment.

FIG. 4 is a schematic diagram of a variable impedance matching network 400 (e.g., variable impedance matching network 360, FIG. 3), in accordance with an example embodiment. As will be explained in more detail below, the variable impedance matching network 400 essentially has two portions: one portion to match the RF signal source (or the final stage power amplifier); and another portion to match the cavity plus load. The impedance matching network 400 of FIG. 4 is only an example impedance matching network, as other network configurations may be utilized. For example, matching network 400 is connected between a positive input voltage and ground. In other embodiments, impedance matching networks may be implemented that are connected by a positive input voltage and a negative voltage of the same magnitude. In still other variable impedance matching networks, the functionality provided by one or more of the inductors depicted in FIG. 4 may be replaced by suitably-configured capacitors or other components.

Variable impedance matching network 400 includes an input node 402, an output node 404, first and second variable inductance networks 410, 411, and a set 430 or plurality of fixed-value inductors 412-415, according to an embodiment. When incorporated into a heating system (e.g., system 300, FIG. 3), the input node 402 is electrically coupled to an output of the RF signal source (e.g., RF signal source 340, FIG. 3), and the output node 404 is electrically coupled to an electrode (e.g., first electrode 370, FIG. 3) within the heating cavity (e.g., heating cavity 310, FIG. 3).

As used herein, a "series inductance" of a matching network is an inductance coupled between input and output nodes of the network. In contrast, a "shunt inductance" of a matching network is an inductance coupled between a node along a path between the input and output nodes and a voltage reference node (e.g., a ground reference). Thus, in network 400, inductors 412, 414 form a series inductance between nodes 402, 404, inductor 410 is a first shunt inductance, inductors 411, 413 form a second shunt inductance, and inductor 415 is a third shunt inductance.

Between the input and output nodes 402, 404, the variable impedance matching network 400 includes first and second, series-coupled fixed-value inductors 412, 414, in an embodiment. The first and second inductors 412, 414 have a series inductance, and as will be described in more detail later, the effective value of this series inductance is modified during a heating operation based on the measured and calculated phase of the load reflection coefficient. More specifically, the effective value of the series inductance is defined by the values of inductors 412, 414 as modified by one or more shunt inductances. The system calculates values for the shunt inductance(s) needed to transform the load to a point where the effective series inductance closely matches the load, and the system modifies the shunt inductance(s) to the calculated values (e.g., by altering the inductance values provided by variable inductors 410, 411). The first and second fixed-value inductors 412, 414 are relatively large in both size and inductance value, in an embodiment, as they may be designed for relatively low frequency (e.g., about 4.66 MHz to about 4.68 MHz) and high power (e.g., about 50 watts (W) to about 1,000 W) operation. For example, inductors 412, 414 may have values in a range of about 200 nanohenries (nH) to about 600 nH, although their values may be lower and/or higher, in other embodiments. In the illustrated embodiment, the series inductance provided by network 400 includes the inductances provided by inductors 412, 414, and the network 400 further includes three shunt inductances, where two of the shunt inductances are variable. In alternate embodiments, the series inductance may include a single inductor or more than two inductors (and/or a variable inductance), and/or there may be fewer or more than three shunt inductances, where fewer or more than two if the shunt inductances are variable.

First variable inductance network 410 is a first shunt inductive network that is coupled between input node 402 and a ground reference terminal (e.g., the grounded containment structure 312, FIG. 3). According to an embodiment, first variable inductance network 410 is configurable to match the impedance of the RF signal source (e.g., RF signal source 340, FIG. 3), or more particularly to match final stage power amplifier (e.g., amplifier 346, FIG. 3). Accordingly, first variable inductance network 410 may be referred to as the "power amplifier matching portion" of variable impedance matching network 400. In this disclosure, first variable inductance network 410 may also be referred to as a variable shunt inductance of variable impedance matching network 400. According to an embodiment, and as will be described in more detail in conjunction with FIG. 5, first variable inductance network 410 includes a network of inductive components that may be selectively coupled together to provide inductances in a range of about 20 nH to about 400 nH, although the range may extend to lower or higher inductance values, as well.

In contrast, the "cavity matching portion" of variable impedance matching network 400 is provided by second shunt inductive network 416 that is coupled between node 420 between first and second inductors 412, 414 and the ground reference terminal. According to an embodiment, second shunt inductive network 416 includes third inductor 413 and second variable inductance network 411 coupled in series, with intermediate node 422 between third inductor 413 and second variable inductance network 411. In this disclosure, second variable inductance network 411 may be referred to as a variable series inductance of variable impedance matching network 400. Because the state of second variable inductance network 411 may be changed to provide multiple inductance values, second shunt inductive network 416 is configurable to optimally match the impedance of the cavity plus load (e.g., cavity 310 plus load 316, FIG. 3). For example, inductor 413 may have a value in a range of about 400 nH to about 800 nH, although its value may be lower and/or higher, in other embodiments. According to an embodiment, and as will be described in more detail in conjunction with FIG. 5, second variable inductance network 411 includes a network of inductive components that may be selectively coupled together to provide inductances in a range of about 50 nH to about 800 nH, although the range may extend to lower or higher inductance values, as well.

Finally, variable impedance matching network 400 includes fourth inductor 415 coupled between the output node 404 and the ground reference terminal. For example, inductor 415 may have a value in a range of about 400 nH to about 800 nH, although its value may be lower and/or higher, in other embodiments.

As will be described in more detail in conjunction with FIGS. 7 and 8, set 430 of inductors 412-415 may be physically located within the cavity (e.g., cavity 310, FIG. 3), or at least within the confines of the containment structure (e.g., containment structure 312, FIG. 3). This enables the radiation produced by inductors 412-415 to be safely contained within the system, rather than being radiated out into the surrounding environment. In contrast, variable inductance networks 410, 411 may or may not be contained within the cavity or the containment structure, in various embodiments.

According to an embodiment, the variable impedance matching network 400 embodiment of FIG. 4 includes "only inductors" to provide a match for the input impedance of heating cavity 310 plus load 316. Thus, variable impedance matching network 400 may be considered an "inductor-only" matching network. As used herein, the phrases "only inductors" or "inductor-only" when describing the components of the variable impedance matching network means that the network does not include discrete resistors with significant resistance values or discrete capacitors with significant capacitance values. In some cases, conductive transmission lines between components of the matching network may have minimal resistances, and/or minimal parasitic capacitances may be present within the network. Such minimal resistances and/or minimal parasitic capacitances are not to be construed as converting embodiments of the "inductor-only" network into a matching network that also includes resistors and/or capacitors. Those of skill in the art would understand, however, that other embodiments of variable impedance matching networks may include differently configured inductor-only matching networks, and matching networks that include combinations of discrete inductors, discrete capacitors, and/or discrete resistors. As will be described in more detail in conjunction with FIG. 6, an "inductor-only" matching network alternatively may be defined as a matching network that enables impedance matching of a capacitive load using solely or primarily inductive components.

Figure 5:
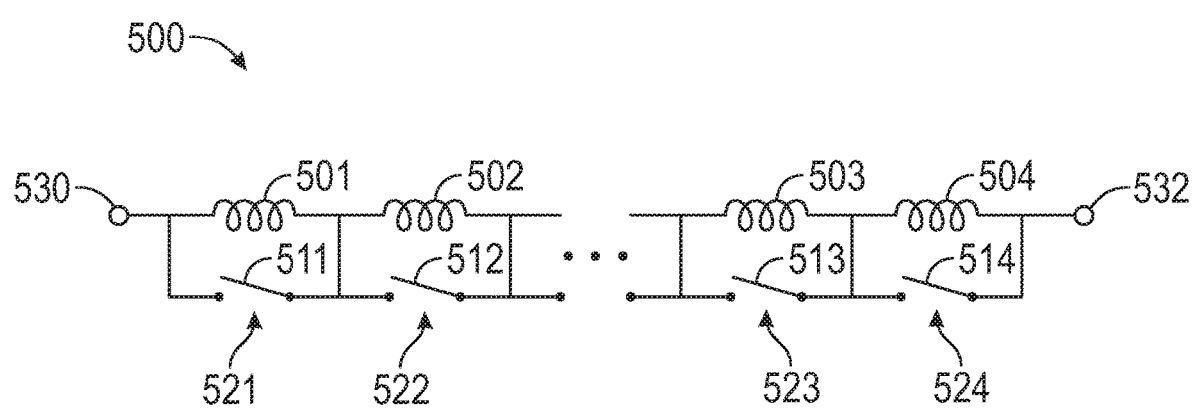
FIG. 5 is a schematic diagram of a variable inductance network, in accordance with an example embodiment.

FIG. 5 is a schematic diagram of variable inductance network 500 that may be incorporated into a variable impedance matching network (e.g., as variable inductance networks 410 and/or 411, FIG. 4), in accordance with an example embodiment. Network 500 includes input node 530, output node 532, and a plurality, N, of discrete inductors 501-504 coupled in series with each other between input and output nodes 530, 523, where N may be an integer between 2 and 10, or more. In addition, network 500 includes a plurality, N, of switches 511-514, where each switch 511-514 is coupled in parallel across the terminals of one of the inductors 501-504. Switches 511-514 may be implemented as transistors, mechanical relays or mechanical switches, for example. The electrically conductive state of each switch 511-514 (i.e., open or closed) is controlled using control signals 521-524 from system controller (e.g., system controller 330, FIG. 3).

For each parallel inductor/switch combination, substantially all current flows through the inductor when its corresponding switch is in an open or non-conductive state, and substantially all current flows through the switch when the switch is in a closed or conductive state. For example, when all switches 511-514 are open, as illustrated in FIG. 5, substantially all current flowing between input and output nodes 530, 532 flows through the series of inductors 501-504. This configuration represents the maximum inductance state of the network 500 (i.e., the state of network 500 in which a maximum inductance value is present between input and output nodes 530, 532). Conversely, when all switches 511-514 are closed, substantially all current flowing between input and output nodes 530, 532 bypasses the inductors 501-504 and flows instead through the switches 511-514 and the conductive interconnections between nodes 530, 532 and switches 511-514. This configuration represents the minimum inductance state of network 500 (i.e., the state of network 500 in which a minimum inductance value is present between input and output nodes 530, 532). Ideally, the minimum inductance value would be near zero inductance. However, in practice a "trace" inductance is present in the minimum inductance state due to the cumulative inductances of switches 511-514 and the conductive interconnections between nodes 530, 532 and switches 511-514. For example, in the minimum inductance state, the trace inductance for variable inductance network 500 may be in a range of about 20 nH to about 50 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through network 500.

Starting from the maximum inductance state in which all switches 511-514 are open, the system controller may provide control signals 521-524 that result in the closure of any combination of switches 511-514 in order to reduce the inductance of network 500 by bypassing corresponding combinations of inductors 501-504. In one embodiment, each inductor 501-504 has substantially the same inductance value, referred to herein as a normalized value of I. For example, each inductor 501-504 may have a value in a range of about 100 nH to about 200 nH, or some other value. In such an embodiment, the maximum inductance value for network 500 (i.e., when all switches 511-514 are in an open state) would be about N×I, plus any trace inductance that may be present in network 500 when it is in the maximum inductance state. When any n switches are in a closed state, the inductance value for network 500 would be about (N−n)×I (plus trace inductance). In such an embodiment, the state of network 500 may be configured to have any of N+1 values of inductance.

In an alternate embodiment, inductors 501-504 may have different values from each other. For example, moving from the input node 530 toward the output node 532, the first inductor 501 may have a normalized inductance value of I, and each subsequent inductor 502-504 in the series may have a larger or smaller inductance value. For example, each subsequent inductor 502-504 may have an inductance value that is a multiple (e.g., about twice) the inductance value of the nearest downstream inductor 501-503, although the difference may not necessarily be an integer multiple. In such an embodiment, the state of the network 500 may be configured to have any of $2^N$ values of inductance. For example, when N=4 and each inductor 501-504 has a different value, the network 500 may be configured to have any of 16 values of inductance. For example but not by way of limitation, assuming that inductor 501 has a value of I, inductor 502 has a value of 2×I, inductor 503 has a value of 4×I, and inductor 504 has a value of 8×I, Table 1, below indicates the total inductance value for all 16 possible states of the network 500 (not accounting for trace inductances):

TABLE 1

Total inductance values for all possible variable inductance network states

| Network state | Switch 511 state (501 value = I) | Switch 512 state (502 value = 2 × I) | Switch 513 state (503 value = 4 × I) | Switch 514 state (504 value = 8 × I) | Total network inductance (w/o trace inductance) |
|---|---|---|---|---|---|
| 0 | closed | closed | closed | closed | 0 |
| 1 | open | closed | closed | closed | I |
| 2 | closed | open | closed | closed | 2 × I |
| 3 | open | open | closed | closed | 3 × I |
| 4 | closed | closed | open | closed | 4 × I |
| 5 | open | closed | open | closed | 5 × I |
| 6 | closed | open | open | closed | 6 × I |
| 7 | open | open | open | closed | 7 × I |
| 8 | closed | closed | closed | open | 8 × I |
| 9 | open | closed | closed | open | 9 × I |
| 10 | closed | open | closed | open | 10 × I |
| 11 | open | open | closed | open | 11 × I |
| 12 | closed | closed | open | open | 12 × I |
| 13 | open | closed | open | open | 13 × I |
| 14 | closed | open | open | open | 14 × I |
| 15 | open | open | open | open | 15 × I |

Referring again to FIG. 4, an embodiment of variable inductance network 410 may be implemented in the form of variable inductance network 500 with the above-described example characteristics (i.e., N=4 and each successive inductor is about twice the inductance of the preceding inductor). Assuming that the trace inductance in the minimum inductance state is about 20 nH, and the range of inductance values achievable by network 410 is about 20 nH (trace inductance) to about 400 nH, the values of inductors 501-504 may be, for example, about 30 nH, about 50 nH, about 100 nH, and about 200 nH, respectively. Similarly, if an embodiment of variable inductance network 411 is implemented in the same manner, and assuming that the trace inductance is about 50 nH and the range of inductance values achievable by network 411 is about 50 nH (trace inductance) to about 800 nH, the values of inductors 501-504 may be, for example, about 50 nH, about 100 nH, about 200 nH, and about 400 nH, respectively. Of course, more or fewer than four inductors 501-504 may be included in either variable inductance network 410, 411, and the inductors within each network 410, 411 may have different values.

Although the above example embodiment specifies that the number of switched inductances in network 500 equals four, and that each inductor 501-504 has a value that is some multiple of a value of I, alternate embodiments of variable inductance networks may have more or fewer than four inductors, different relative values for the inductors, a different number of possible network states, and/or a different configuration of inductors (e.g., differently connected sets of parallel and/or series coupled inductors). Either way, by providing a variable inductance network in an impedance matching network of a heating system, the system may be better able to match the ever-changing cavity input impedance that is present during a heating operation.

In implementations, variable inductance network 500 may be implemented with hundreds or more inductors, each with a corresponding switch, enabling variable inductance network 500 to exhibit a large number (e.g., thousands) of potential inductance states. For example, an implementation of variable inductance network 500 having eleven different switched inductors, each having different inductance values, may be used to generate thousands of different impedance values.

Figure 6:
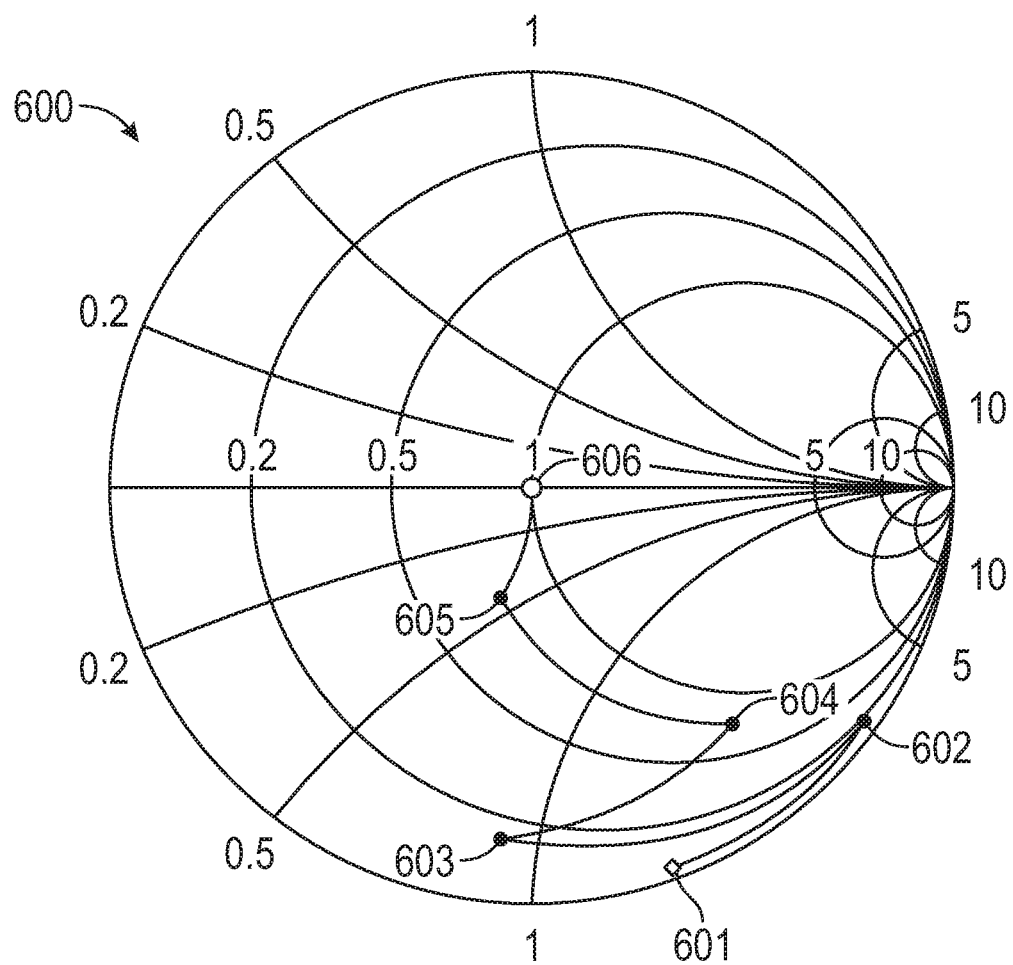
FIG. 6 is an example of a Smith chart depicting how a plurality of inductances in an embodiment of a variable impedance matching network may match the input cavity impedance to an RF signal source.

FIG. 6 is an example of a Smith chart 600 depicting how the plurality of inductances in an embodiment of a variable impedance matching network (e.g., network 360, 400, FIGS. 3, 4) may match the input cavity impedance to the RF signal source. The chart of FIG. 6 depicts impedance of the system. The example Smith chart 600 assumes that the system is a 50 Ohm system, and that the output of the RF signal source is 50 Ohms. Those of skill in the art would understand, based on the description herein, how the Smith chart could be modified for a system and/or RF signal source with different characteristic impedances.

In Smith chart 600, point 601 corresponds to the point at which the load (e.g., the cavity 310 plus load 316, FIG. 3) would locate (e.g., at the beginning of a heating operation) absent the matching provided by the variable impedance matching network (e.g., network 360, 400, FIGS. 3, 4). As indicated by the position of the load point 601 in the lower right quadrant of the Smith chart 600, the load is a capacitive load. According to an embodiment, the shunt and series inductances of the variable impedance matching network sequentially move the substantially-capacitive load impedance toward an optimal matching point 606 (e.g., 50 Ohms) at which RF energy transfer to the load may occur with minimal losses. More specifically, and referring also to FIG. 4, shunt inductance 415 moves the impedance to point 602, series inductance 414 moves the impedance to point 603, shunt inductance 416 moves the impedance to point 604, series inductance 412 moves the impedance to point 605, and shunt inductance 410 moves the impedance to the optimal matching point 606.

It should be noted that the combination of impedance transformations provided by embodiments of the variable impedance matching network keep the impedance at any point within or very close to the lower right quadrant of the Smith chart 600. As this quadrant of the Smith chart 600 is characterized by relatively high impedances and relatively low currents, the impedance transformation is achieved without exposing components of the circuit to relatively high and potentially damaging currents. Accordingly, an alternate definition of an "inductor-only" matching network, as used herein, may be a matching network that enables impedance matching of a capacitive load using solely or primarily inductive components, where the impedance matching network performs the transformation substantially within the lower right quadrant of the Smith chart.

As discussed previously, the impedance of the load changes during the heating operation. Accordingly, point 601 correspondingly moves during the heating operation. Movement of load point 601 is compensated for, according to the previously-described embodiments, by varying the impedance of the first and second shunt inductances 410, 411 so that the final match provided by the variable impedance matching network still may arrive at or near the optimal matching point 606. Although a specific variable impedance matching network has been illustrated and described herein, those of skill in the art would understand, based on the description herein, that differently-configured variable impedance matching networks may achieve the same or similar results to those conveyed by Smith chart 600. For example, alternative embodiments of a variable impedance matching network may have more or fewer shunt and/or series inductances, and or different ones of the inductances may be configured as variable inductance networks (e.g., including one or more of the series inductances). Accordingly, although a particular variable inductance matching network has been illustrated and described herein, the inventive subject matter is not limited to the illustrated and described embodiment.

A particular physical configuration of a heating system will now be described in conjunction with FIGS. 7 and 8. More particularly, FIG. 7 is a cross-sectional, side view of heating system 700, in accordance with an example embodiment, and FIG. 8 is a perspective view of a portion of heating system 700. Heating system 700 generally includes heating cavity 774, a user interface (not shown), system controller 730, RF signal source 740, power supply and bias circuitry (not shown), power detection circuitry 780, variable impedance matching network 760, first electrode 770, and second electrode 772, in an embodiment. In addition, in some embodiments, defrosting system 700 may include weight sensor(s) 790, temperature sensor(s), and/or IR sensor(s) 792.

Heating system 700 is contained within containment structure 750, in an embodiment. According to an embodiment, containment structure 750 may define three interior areas: heating cavity 774, fixed inductor area 776, and circuit housing area 778. Containment structure 750 includes bottom, top, and side walls. Portions of the interior surfaces of some of the walls of containment structure 750 may define heating cavity 774. Heating cavity 774 includes a capacitive heating arrangement with first and second parallel plate electrodes 770, 772 that are separated by an air cavity within which load 716 may be placed. For example, first electrode 770 may be positioned above the air cavity, and second electrode 772 may be provided by a conductive portion of containment structure 750 (e.g., a portion of the bottom wall of containment structure 750). Alternatively, second electrode 772 may be formed from a conductive plate that is distinct from containment structure 750. According to an embodiment, non-electrically conductive support structure(s) 754 may be employed to suspend first electrode 770 above the air cavity, to electrically isolate first electrode 770 from containment structure 750, and to hold first electrode 770 in a fixed physical orientation with respect to the air cavity.

According to an embodiment, containment structure 750 is at least partially formed from conductive material, and the conductive portion(s) of the containment structure may be grounded to provide a ground reference for various electrical components of the system. Alternatively, at least the portion of containment structure 750 that corresponds to second electrode 772 may be formed from conductive material and grounded. To avoid direct contact between load 716 and second electrode 772, non-conductive barrier 756 may be positioned over second electrode 772.

When included in the system 700, the weight sensor(s) 790 are positioned under load 716. Weight sensor(s) 790 are configured to provide an estimate of the weight of load 716 to system controller 730. When included, the temperature sensor(s) and/or IR sensor(s) 792 may be positioned in locations that enable the temperature of load 716 to be sensed both before, during, and after a heating operation. According to an embodiment, the temperature sensor(s) and/or IR sensor(s) 792 are configured to provide load temperature estimates to system controller 730.

Some or all of the various components of system controller 730, RF signal source 740, the power supply and bias circuitry (not shown), power detection circuitry 780, and portions 710, 711 of the variable impedance matching network 760, may be coupled to common substrate 752 within circuit housing area 778 of containment structure 750, in an embodiment. According to an embodiment, system controller 730 is coupled to the user interface, RF signal source 740, variable impedance matching network 760, and power detection circuitry 780 through various conductive interconnects on or within common substrate 752. In addition, power detection circuitry 780 is coupled along transmission path 748 between the output of RF signal source 740 and input 702 to variable impedance matching network 760, in an embodiment. For example, substrate 752 may include a microwave or RF laminate, a polytetrafluoroethylene (PTFE) substrate, a printed circuit board (PCB) material substrate (e.g., FR-4), an alumina substrate, a ceramic tile, or another type of substrate. In various alternate embodiments, various ones of the components may be coupled to different substrates with electrical interconnections between the substrates and components. In still other alternate embodiments, some or all of the components may be coupled to a cavity wall, rather than being coupled to a distinct substrate.

First electrode 770 is electrically coupled to RF signal source 740 through variable impedance matching network 760 and transmission path 748, in an embodiment. As discussed previously, variable impedance matching network 760 includes variable inductance networks 710, 711 (e.g., networks 410, 411, FIG. 4) and a plurality of fixed-value inductors 712-715 (e.g., inductors 412-415, FIG. 4). In an embodiment, variable inductance networks 710, 711 are coupled to common substrate 752 and located within circuit housing area 778. In contrast, inductors 712-715 are positioned within fixed inductor area 776 of containment structure 750 (e.g., between common substrate 752 and first electrode 770). Conductive structures (e.g., conductive vias or other structures) may provide for electrical communication between the circuitry within circuit housing area 778 and inductors 712-715 within fixed inductor area 776.

For enhanced understanding of system 700, the nodes and components of variable impedance matching network 760 depicted in FIGS. 7 and 8 can be correlated with nodes and components of variable impedance matching network 400 depicted in FIG. 4. More specifically, variable impedance matching network 760 includes an input node 702 (e.g., input node 402, FIG. 4), an output node 704 (e.g., output node 404, FIG. 4), first and second variable inductance networks 710, 711 (e.g., variable inductance networks 410, 411, FIG. 4), and a plurality of fixed-value inductors 712-715 (e.g., inductors 412-415, FIG. 4), according to an embodiment. Input node 702 is electrically coupled to an output of RF signal source 740 through various conductive structures (e.g., conductive vias and traces), and output node 704 is electrically coupled to first electrode 770.

Between input and output nodes 702, 704 (e.g., input and output nodes 402, 404, FIG. 4), variable impedance matching network 700 includes four fixed-value inductors 712-715 (e.g., inductors 412-415, FIG. 4), in an embodiment, which are positioned within fixed inductor area 776. Inductors 712-715 may be lumped inductors. An enhanced understanding of an embodiment of a physical configuration of inductors 712-715 within fixed inductor area 776 may be achieved by referring to both FIG. 7 and to FIG. 8 simultaneously, where FIG. 8 depicts a top perspective view of fixed inductor area 776. In FIG. 8, the irregularly shaped, shaded areas underlying inductors 712-715 represents suspension of the inductors 712-715 in space over first electrode 770. In other words, the shaded areas indicate where inductors 712-715 are electrically insulated from first electrode 770 by air. Rather than relying on an air dielectric, non-electrically conductive spacers may be included in these areas.

In an embodiment, first inductor 712 has a first terminal that is electrically coupled to input node 702 (and thus to the output of RF signal source 740), and a second terminal that is electrically coupled to first intermediate node 720 (e.g., node 420, FIG. 4). Second inductor 713 has a first terminal that is electrically coupled to first intermediate node 720, and a second terminal that is electrically coupled to second intermediate node 722 (e.g., node 422, FIG. 4). Third inductor 714 has a first terminal that is electrically coupled to first intermediate node 720, and a second terminal that is electrically coupled to output node 704 (and thus to first electrode 770). Fourth inductor 715 has a first terminal that is electrically coupled to output node 704 (and thus to first electrode 770), and a second terminal that is electrically coupled to a ground reference node (e.g., to grounded containment structure 750 through one or more conductive interconnects).

First variable inductance network 710 (e.g., network 410, FIG. 4) is electrically coupled between input node 702 and a ground reference terminal (e.g., grounded containment structure 750). Finally, second shunt inductive network 716 is electrically coupled between second intermediate node 722 and the ground reference terminal.

Figure 9:
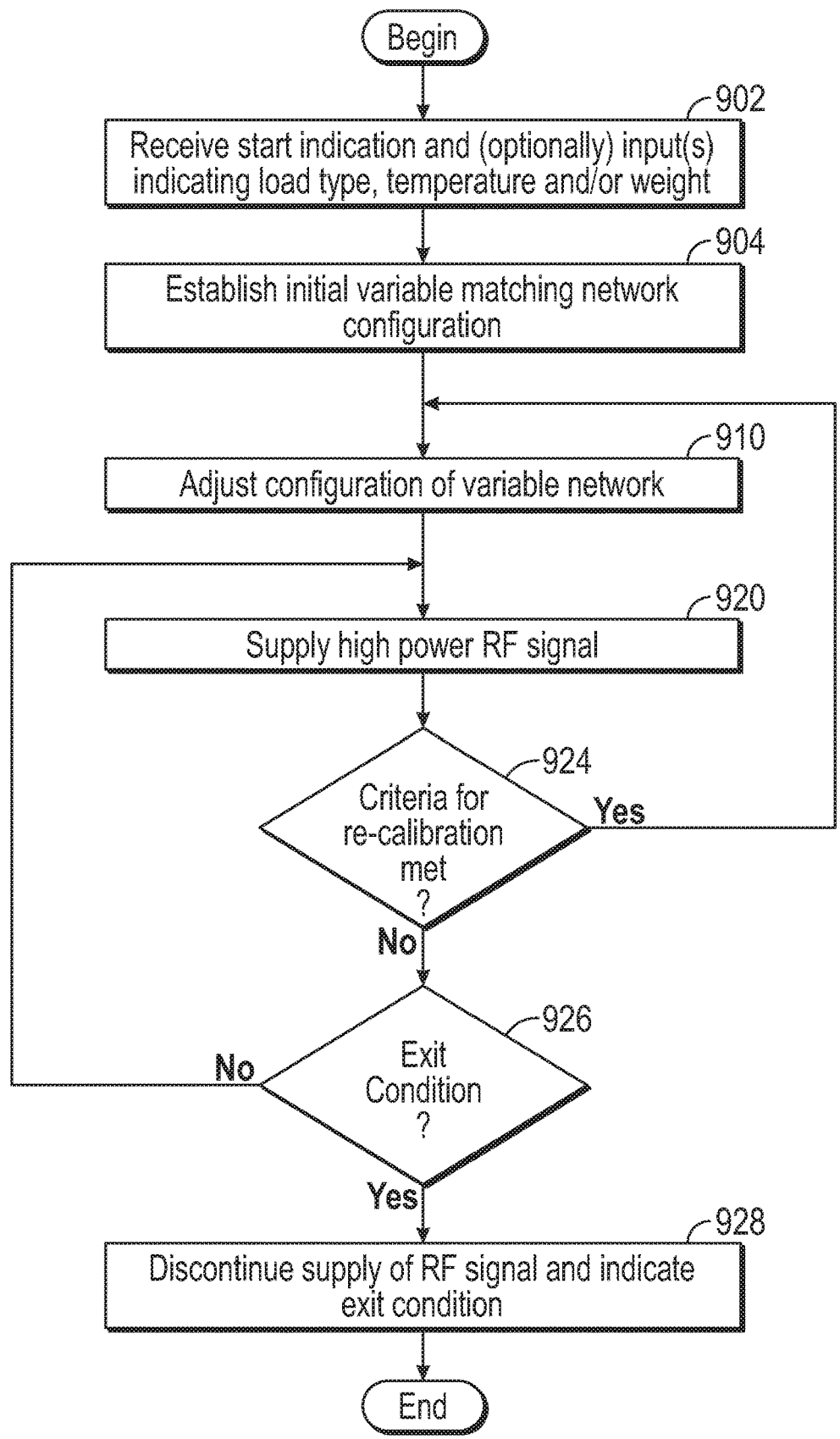
FIG. 9 is a flowchart of a method of operating a defrosting system with dynamic load matching, in accordance with an example embodiment.

Now that embodiments of the electrical and physical aspects of heating systems have been described, various embodiments of methods for operating such systems will now be described in conjunction with FIG. 9. More specifically, FIG. 9 is a flowchart of a method of operating a heating system (e.g., system 100, 210, 220, 300, 700, FIGS. 1-3, 7) with dynamic load matching, in accordance with an example embodiment.

The method may begin, in block 902, when the system controller (e.g., system controller 330, FIG. 3) receives an indication that a heating operation should start. Such an indication may be received, for example, after a user has placed a load (e.g., load 316, FIG. 3) into the system's heating cavity (e.g., cavity 310, FIG. 3), has sealed the cavity (e.g., by closing a door or drawer), and has pressed a start button (e.g., of the user interface 320, FIG. 3). In an embodiment, sealing of the cavity may engage one or more safety interlock mechanisms, which when engaged, indicate that RF power supplied to the cavity will not substantially leak into the environment outside of the cavity. As will be described later, disengagement of a safety interlock mechanism may cause the system controller immediately to pause or terminate the heating operation.

According to various embodiments, the system controller optionally may receive additional inputs indicating the load type (e.g., meats, liquids, or other materials), the initial load temperature, and/or the load weight. For example, information regarding the load type may be received from the user through interaction with the user interface (e.g., by the user selecting from a list of recognized load types). Alternatively, the system may be configured to scan a barcode visible on the exterior of the load, or to receive an electronic signal from an RFID device on or embedded within the load or in the load's packaging. Information regarding the initial load temperature may be received, for example, from one or more temperature sensors and/or IR sensors (e.g., sensors 390, 792, FIGS. 3, 7) of the system. Information regarding the load weight may be received from the user through interaction with the user interface, or from a weight sensor (e.g., sensor 390, 790, FIGS. 3, 7) of the system. As indicated above, receipt of inputs indicating the load type, initial load temperature, and/or load weight is optional, and the system alternatively may not receive some or all of these inputs.

In block 904, the system controller provides control signals to the variable matching network (e.g., network 360, 400, FIGS. 3, 4) to establish an initial configuration or state for the variable impedance matching network. As described in detail in conjunction with FIGS. 4 and 5, the control signals affect the inductances of variable inductance networks (e.g., networks 410, 411, FIG. 4) within the variable impedance matching network. For example, the control signals may affect the states of bypass switches (e.g., switches 511-514, FIG. 5), which are responsive to the control signals from the system controller (e.g., control signals 521-524, FIG. 5).

As also discussed previously, a first portion of the variable impedance matching network may be configured to provide a match for the RF signal source (e.g., RF signal source 340, FIG. 3) or the final stage power amplifier (e.g., power amplifier 346, FIG. 3), and a second portion of the variable matching network may be configured to provide a match for the cavity (e.g., cavity 310, FIG. 3) plus the load (e.g., load 316, FIG. 3). For example, referring to FIG. 4, a first shunt, variable inductance network 410 may be configured to provide the RF signal source match, and a second shunt, variable inductance network 416 may be configured to provide the cavity plus load match.

The system controller may determine an initial configuration for the variable impedance matching network based on load type/weight/temperature information known to the system controller a priori. If no a priori load type/weight/ temperature information is available to the system controller, the system controller may select a relatively low default inductance for the RF signal source match and a relatively high default inductance for the cavity match.

After the initial variable impedance matching network configuration is established, the system controller may perform a process 910 of adjusting, if necessary, the configuration of the variable impedance matching network to find an acceptable or best match based on actual measurements that are indicative of the quality of the match. An example algorithm for the system controller to adjust the configuration of the variable impedance matching network to find an acceptable or best match is further illustrated in FIG. 10 and described below.

After an acceptable or best match for the variable impedance matching network is determined, the heating operation may commence. Commencement of the heating operation can include increasing the power of the RF signal supplied by the RF signal source (e.g., RF signal source 340) to a relatively high power RF signal, in block 920. The system controller may control the RF signal power level through control signals to the power supply and bias circuitry (e.g., circuitry 350, FIG. 3), where the control signals cause the power supply and bias circuitry to provide supply and bias voltages to the amplifiers (e.g., amplifier stages 344, 346, FIG. 3) that are consistent with the desired signal power level. For example, the relatively high power RF signal may be a signal having a power level in a range of about 100 W to about 1,000 W or more, although different power levels alternatively may be used.

In block 924, the system controller may determine, whether a criteria has been met for re-calibrating the variable impedance matching network. The criteria may be met, for example, when a predetermined period of time has elapsed since the last time the matching algorithm of block 910 was implemented or executed. Alternatively, the criteria may involve the system controller comparing a single calculated reflected-to-forward signal power ratio or S11 parameter to a threshold (either a predetermined threshold or a threshold based upon prior signal power ratios). This may also involve the system controller taking an average (or other calculation) of a number of previously-calculated reflected-to-forward power ratios or S11 parameters. To determine whether or not the criteria has been satisfied, the system controller may compare the calculated ratio and/or S11 parameter to a threshold, for example. For example, in one embodiment, the system controller may compare the calculated reflected-to-forward signal power ratio to a threshold of 10 percent (or some other value). A ratio below 10 percent may indicate that the match remains acceptable and that the criteria has not been met, while a ratio above 10 percent may indicate that the criteria has been met and that the match is no longer acceptable.

When the criteria for recalibration has been met, indicating a potentially unacceptable match, then the system controller may initiate re-configuration of the variable impedance matching network by again performing process 910. This can make the heating process more efficient because, as discussed previously, the match provided by the variable impedance matching network may degrade or change over the course of a heating operation due to impedance changes of the load (e.g., load 316, FIG. 3) as the load warms up. For example, as food defrosts or cooks, the food's internal structure changes causing the food's impedance to change. This, in turn, reduces the match achieved by the variable impedance matching network, which reduces the efficient of energy transmission into the food load.

Referring back to block 924, when the system controller determines that the criteria for recalibration of the variable impedance network has not been met, the system may evaluate whether or not an exit condition has occurred, in block 926. In actuality, determination of whether an exit condition has occurred may be an interrupt driven process that may occur at any point during the heating process. However, for the purposes of including it in the flowchart of FIG. 9, the process is shown to occur after block 924.

In any event, several conditions may warrant cessation of the heating operation. For example, the system may determine that an exit condition has occurred when a safety interlock is breached. Alternatively, the system may determine that an exit condition has occurred upon expiration of a timer that was set by the user (e.g., through user interface 320, FIG. 3) or upon expiration of a timer that was established by the system controller based on the system controller's estimate of how long the heating operation should be performed. In still another alternate embodiment, the system may otherwise detect completion of the heating operation.

If an exit condition has not occurred, then the heating operation may continue by iteratively performing blocks 920 and 924 (and the matching network reconfiguration process 910, as necessary). When an exit condition has occurred, then in block 928, the system controller causes the supply of the RF signal by the RF signal source to be discontinued. For example, the system controller may disable the RF signal generator (e.g., RF signal generator 342, FIG. 3) and/or may cause the power supply and bias circuitry (e.g., circuitry 350, FIG. 3) to discontinue provision of the supply current. In addition, the system controller may send signals to the user interface (e.g., user interface 320, FIG. 3) that cause the user interface to produce a user-perceptible indicia of the exit condition (e.g., by displaying "door open" or "done" on a display device, or providing an audible tone). The method may then end.

It should be understood that the order of operations associated with the blocks depicted in FIG. 9 corresponds to an example embodiment, and should not be construed to limit the sequence of operations only to the illustrated order. Instead, some operations may be performed in different orders, and/or some operations may be performed in parallel.

Referring back to step 910, the system may implement several approaches for calibrating the variable impedance matching network. For example, the system controller may iteratively test different configurations of the variable impedance matching network to attempt to determine an acceptable configuration that achieves a desired impedance match and desired power transfer into the food load. For example, referring again to Table 1, above, if the current configuration corresponds to state 12 for the cavity matching network and to state 3 for the RF signal source matching network, the system controller may test states 11 and/or 13 for the cavity matching network, and may test states 2 and/or 4 for the RF signal source matching network. If those tests do not yield a favorable result (i.e., an acceptable match), the system controller may test states 10 and/or 14 for the cavity matching network, and may test states 1 and/or 5 for the RF signal source matching network, and so on.

But in an impedance matching network having a large number (e.g., 2048 or some other number) of states, such an iterative approach (i.e., iteratively testing each potential state of the variable impedance matching network) can require an extended period of time that may unacceptably prolong the heating process. For example, it may take as many as 10 seconds or more to test a sufficient number of states of the variable impedance matching network to achieve a satisfactory match. A heating process that lasts only 2 minutes may require the variable impedance matching network be recalibrated a number (e.g., three or more) of times, potentially increasing the heating time considerably.

Figure 10:
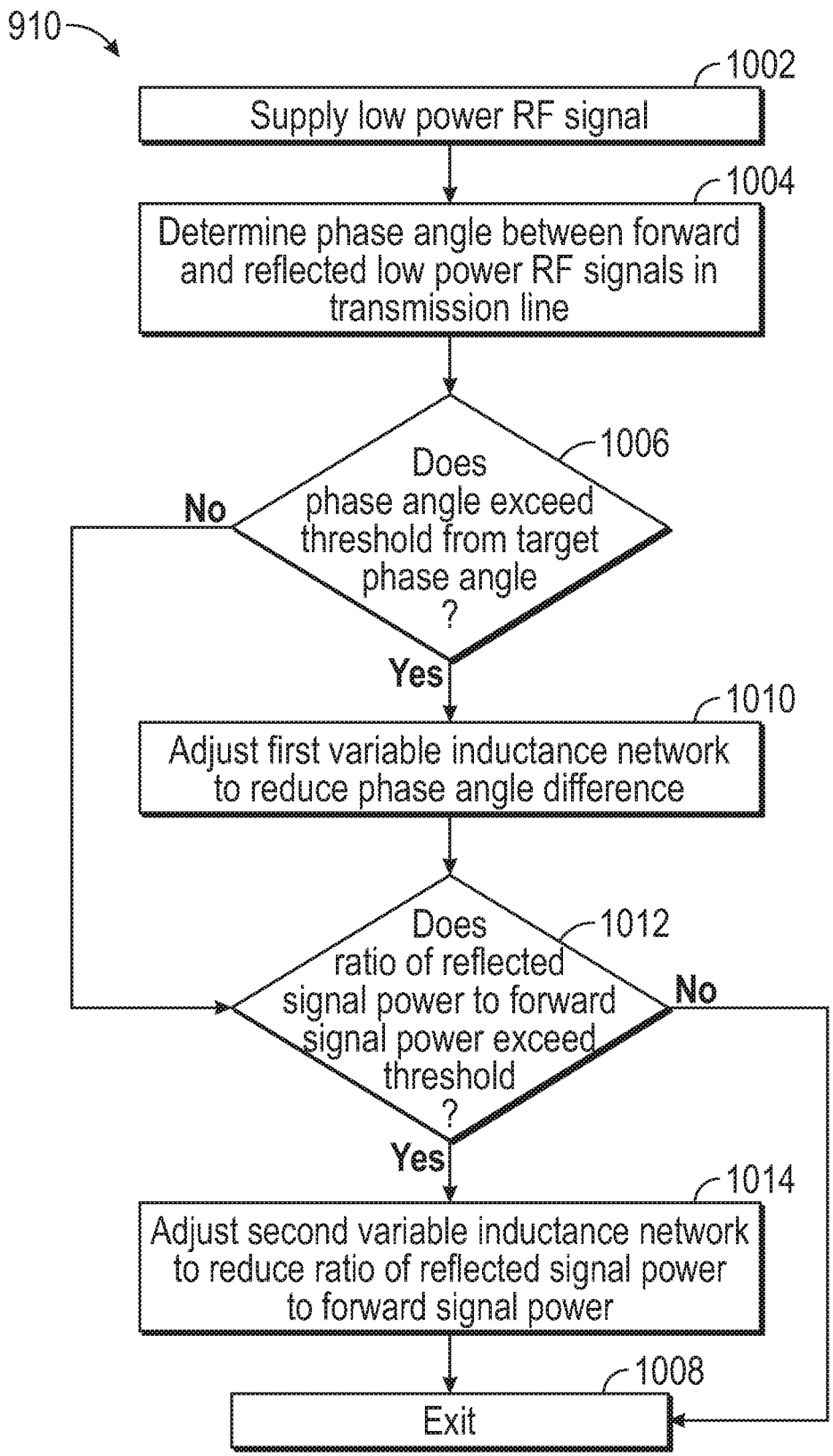
FIG. 10 is a flowchart of a method for adjusting an impedance of a variable impedance matching network to provide load matching.

FIG. 10, therefore, is a flowchart of a method for the system controller to calibrate the variable impedance matching network. The method depicted by FIG. 10 may be implemented by the system controller as part of the execution of the calibration step 910 of FIG. 9, for example. The method of FIG. 10 may be executed during an initial setup of variable impedance matching network before a heating or defrosting operation is initiated, or may be implemented multiple times during a heating or defrosting operation as part of a recalibration process, as illustrated in the flowchart of FIG. 9 as the impedance of the food load in the heating system changes over time. As such, the method of FIG. 10 may be executed iteratively during a defrosting procedure.

According to an embodiment, the power level of the input signal is reduced during periods of time when the variable impedance matching network is being calibrated/recalibrated. Accordingly, this process may include causing the RF signal source (e.g., RF signal source 340) to supply a relatively low power RF signal through the variable impedance matching network to the first electrode (e.g., first electrode 370) in step 1002. The system controller may control the RF signal power level through control signals to the power supply and bias circuitry (e.g., circuitry 350, FIG. 3), where the control signals cause the power supply and bias circuitry to provide supply and bias voltages to the amplifiers (e.g., amplifier stages 344, 346, FIG. 3) that are consistent with the desired signal power level. For example, the relatively low power RF signal may be a signal having a power level in a range of about 10 W to about 20 W, although different power levels alternatively may be used. A relatively low power level signal during the match adjustment process 910 can be desirable in some cases to reduce the risk of damaging the cavity or load (e.g., if the initial match causes high reflected power), and to reduce the risk of damaging the switching components of the variable inductance networks (e.g., due to arcing across the switch contacts). The lower power RF signal may be a continuous wave signal at the typical frequency of operation of the heating system. Note that this step generally interrupts step 920 of the method of FIG. 9, which calls for the delivery of a high power RF signal into the heating chamber.

In step 1004, a controller (e.g., system controller 330 of FIG. 3) determines a phase angle, or reflection coefficient (Γ), between a forward RF signal (or "incident" RF signal) resulting from the low power RF signal generated in step 1002 and a reflected RF signal reflecting from the heating cavity. System controller 330 may use power detection circuitry 380 of FIG. 3 to measure the forward and reflected signals, for example, in a transmission path located between RF signal source 340 and electrode 370. The reflection coefficient, gamma, can be calculated as the difference, in degrees or radians, in the phases of the forward and reflected RF signals measured along the transmission path. For example, the reflection coefficient, $\Gamma_L$, may be calculated as follows:

$$\Gamma_L = \arctan(V+/V-),$$

where V+ denotes the voltage of the incident RF signal, and V− denotes the voltage of the reflected RF signal.

In step 1006, after the phase angle (or gamma) is determined in step 1004, the phase angle is compared to a pre-determined threshold value. Generally, each heating system will be associated with a pre-determined target phase angle that, if observed, indicates acceptable power transfer into the food load being heated (i.e., good matching). This preferred phase angle could be determined using any suitable techniques and may, in some cases, involve testing or simulating the operation of sample heating systems with typical food loads placed therein in order to directly measure a phase angle for that particular heating system that indicates efficient operation. According to an embodiment, the target phase angle is in a range of less than 5 degrees to about less than 45 degrees, although the target phase angle could be lower or higher, as well. The pre-determined threshold may be, for example, the maximum target phase angle.

When the value of gamma ($\Gamma_L$) calculated from the ratio of the incident and reflected RF signals compares unfavorably to the pre-determined threshold, the system controller then adjusts the amount of effective series inductance introduced by the variable impedance matching network (e.g., network 400). The calibration process will be explained below with reference to the Smith Chart.

Figure 11:
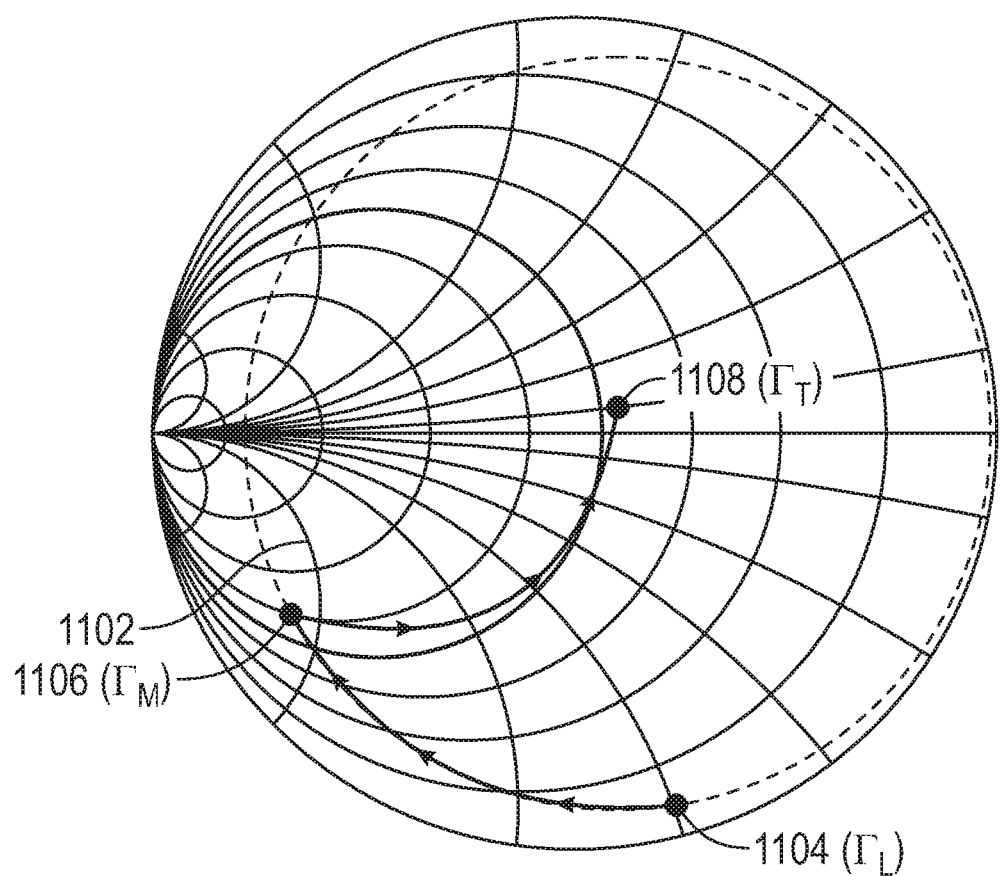
FIG. 11 is a Smith chart depicting the adjustment of an impedance of variable impedance matching network to provide impedance matching.

FIG. 11 is a Smith chart depicting an example calibration process that may be performed by the method of FIG. 9. The chart of FIG. 11 depicts admittance of the system. In FIG. 11, for example, line 1102 may represent a preferred phase angle for the heating system being calibrated. In one type of device, for example, the target phase angle may be equal to 5 degrees.

When the difference between the calculated phase angle and the target phase angle for the heating system is less than a threshold value (indicating that the measured phase angle is close to the target phase angle), the method may proceed to step 1012. If, however, the difference between the calculated phase angle and the target phase angle for the heating system is greater than a threshold value, the method may proceed to step 1010.

Referring to FIG. 11, point 1104 corresponds to a point (e.g., $\Gamma_L$) at which the phase angle between the forward RF signal and the reflected RF signal is significant and exceeds the threshold as established in step 1006. In a typical system, the threshold phase angle may be less than 5 degrees to about less than 45 degrees.

Returning to FIG. 10, when, in step 1006 the controller determines that the phase angle exceeds the pre-determined target phase angle, in step 1010 the controller adjusts a variable inductance network (e.g., in a matching network such as that depicted in FIG. 4, the controller may adjust one or both of variable inductances 410, 411 though in other matching networks, different inductances (or capacitances) may be adjusted) within the variable impedance matching network to move the phase angle measured in step 1004 towards the system's target value. This corresponds to transforming $\Gamma_L$ to a point $\Gamma_M$ wherein $\Gamma_M$ is a point on the G=1 matching circle of the chart of FIG. 11. Step 1010 may involve, for example, the controller modifying an inductance of variable inductance network 411 of variable impedance matching network 400 of FIG. 4. Accordingly, step 1010 may involve the controller adjusting the variable impedance matching network 400 to provide sufficient series inductance to move the phase angle towards the preferred value for the heating system.

To illustrate this step, with reference to FIG. 11, if the measured phase angle corresponds to point 1104 (indicating that the measured phase angle is substantially different from the targeted phase angle indicated by line 1102), the controller can adjust the effective inductance of the variable impedance matching network's series inductance (e.g., by modifying variable inductance network 411 of variable impedance matching network 400) to move the phase angle towards point 1106 on FIG. 11. As depicted, point 1106 falls on line 1102 representing the target phase angle for the heating system. More specifically, the controller adjusts a shunt inductance network (e.g., network 411) to transform $\Gamma_L$ to the point 1106, where point 1106 is on (or substantially on or near) a same circle of constant resistance as $\Gamma_L$.

Generally, the controller can send control signals to adjust the inductance of variable inductance network 411 in any suitable manner to achieve the target phase angle for the heating system. For example, the system controller may send control signals that randomly change the inductance of variable inductance network 411 and, following each change, re-measure the forward and reflected RF signals and re-calculate the phase angle to determine how the phase angle compares to the pre-determined target phase angle (i.e., whether the measured phase angle is above or below the pre-determined target phase angle). In another embodiment, the controller may send control signals to adjust the inductance of variable inductance network 411 in a manner at least partially determined by comparison of the phase angle determined in step 1004 and the target phase angle for the system. For example, if the phase angle determined in step 1004 is greater than the target phase angle for the heating system (e.g., the phase angle compares unfavorably to the threshold), the controller may iteratively decrease (or otherwise changes) the inductance of variable inductance network 411 until the controller determines that the detected phase angle is sufficiently close (i.e., at or below the threshold value) of the target phase angle. Conversely, if the phase angle determined in step 1004 is less than the target phase angle for the heating system (e.g., the phase angle compares favorably to the threshold), the controller may iteratively increase (or otherwise change) the inductance of variable inductance network 411 until the controller determines that the detected phase angle is sufficiently close (i.e., within the threshold value) of the target phase angle.

The iterative process for adjusting the inductance of variable inductance network 411 may involve iteratively changing the inductance of variable inductance network 411, re-supplying the lower power RF signal, and re-determining the phase angle between the forward and reflected RF signals in the transmission path from the RF source.

While the inductance of variable inductance network 411 is adjusted during the execution of step 1010, the other variable inductance networks within variable impedance matching network 400 may be unchanged (i.e., held at a consistent inductance value) so that only the inductance of variable inductance network 411 is modified. Because only a single variable inductance network is being modified, only available inductance states of that single variable inductance network must be changed, rendering step 1010 more efficient than if step 1010 called for testing the potential states of all variable inductance networks in variable impedance matching network 400 in this step.

Following the completion of step 1010, the phase angle of the heating system will lie on or nearby line 1102 demonstrating that the phase angle now falls within a threshold value of the target phase angle for the heating system. But even if that is the case, the variable impedance matching network may not be fully adjusted to achieve a best or preferred value for impedance matching. Specifically, even if the phase angle is at the target value, the ratio of the power of the reflected RF signal to the forward RF signal (i.e., the S11 parameter) may be too large indicating that the system is not efficiently transferring energy into the food load.

For example, on FIG. 11, point 1108 indicates the point at which variable impedance matching network 400 is acceptably matched and energy is being efficiently transferred into the cavity and load. As such, point 1106, even though meeting the phase angle requirements, depicts an inefficient match in which the S11 parameter for the heating system is relatively large indicating there is inefficient energy transfer into the heating system's load.

Accordingly, returning to FIG. 10, in step 1012 the controller determines whether the ratio of reflected signal power to forward signal power exceeds a particular threshold. For example, the controller may compare the calculated reflected-to-forward signal power ratio to a threshold of 10 percent (or some other value). A ratio below 10 percent may indicate that the match remains acceptable and that the threshold of step 1012 has not been met, while a ratio above 10 percent may indicate that the criteria has been met and that the match is no longer acceptable. Generally, the controller determines the reflected-to-forward signal power ratio using power detection circuitry (e.g., power detection circuitry 380, FIG. 3) to measure the forward and reflected power along the transmission path (e.g., path 348, FIG. 3) between the RF signal source and the first electrode. The controller receives the two values and performs a comparison to determine a ratio between the reflected and forward signal powers, and may determine the S11 parameter for the system based on that ratio. The controller may store the calculated ratios and/or S11 parameters for future evaluation or comparison, in an embodiment.

If the threshold has not been exceeded in step 1012 that indicates that the current configuration of variable impedance matching network 400 is resulting in an optimized transfer of energy into the food load and variable impedance matching network 400 may be considered to be optimally matched within the heating system. As such, the method may move on to step 1008 and exit.

If, however, in step 1012 the threshold has been exceed, that indicates that the current configuration of variable impedance matching network 400 is not resulting in an optimized transfer of energy into the food load. As such, the method moves on to step 1014 to optimize the inductance value of a second variable inductance network within variable impedance matching network 400.

Referring to FIG. 11, point 1106 corresponds to a point at which the S11 parameter (ratio of reflected RF signal to forward RF signal) is sufficiently large to exceed the predetermined threshold. In a typical system, the threshold S11 parameter may be −10 dB, −15 dB, −20 dB or less.

Returning to FIG. 10, if, in step 1012 the controller determines that the S11 parameter exceeds the threshold value, in step 1014 the controller adjusts a second variable inductance network within the variable impedance matching network (e.g., in a matching network such as that depicted in FIG. 4, the controller may adjust one or both of variable inductances 410, 411 though in other matching networks, different inductances (or capacitances) may be adjusted) to reduce the S11 parameter to a value below the predetermined threshold Step 1014 may involve, for example, the controller modifying an inductance of variable inductance network 410 of variable impedance matching network 400 of FIG. 4. Accordingly, step 1014 may involve the controller adjusting variable impedance matching network 400 to provide sufficient shunt inductance to reduce the S11 parameter for the heating system towards the desired value (e.g., point 1108 on FIG. 11). The corresponds to modifying the variable impedance matching network 400 to achieve an amount of shunt inductance necessary to transform $\Gamma_M$ to an impedance $\Gamma_T$ at the point where the G=1 intersects the Γ=0 point on the admittance chart of FIG. 11. As such, the controller adjusts, within the variable impedance matching network, an inductance of variable inductance network 410 to achieve the amount of shunt inductance necessary to $\Gamma_L$ to an impedance at the point 1108 where the G=1 intersects the Γ=0 point on the admittance/impedance chart.

For example, with reference to FIG. 11, if the measured S11 parameter corresponds to point 1106 (indicating that the ratio of measured reflected RF signal power to forward RF signal power exceeds a threshold value), the controller can adjust the inductance of the variable impedance matching network's shunt inductance (e.g., variable inductance network 410 of variable impedance matching network 400) to reduce the S11 parameter towards point 1108 on FIG. 11.

Generally, the controller can adjust the inductance of variable inductance network 410 in any suitable manner to achieve the desired S11 parameter value for the heating system. For example, the system controller may provide control signal to variable inductance network 410 that randomly change the inductance of variable inductance network 410 and, following each change, may re-measure the forward and reflected RF signal powers and re-calculate the S11 parameter to determine whether the new S11 parameter falls within the threshold value. In another embodiment, the controller may adjust the inductance of variable inductance network 410 in a manner at least partially determined by the S11 parameter value determined in step 1012. For example, if the S11 parameter determined in step 1012 is greater than the target value for the heating system, the controller may iteratively decrease the inductance of variable inductance network 410 until the controller determines that the detected S11 parameter is sufficiently close (i.e., within the threshold value) of the target value, though in other embodiments the inductance of variable inductance network 410 may be increased instead.

The iterative process for adjusting the inductance of variable inductance network 410 may involve iteratively changing the inductance of variable inductance network 410, re-supplying the lower power RF signal, and re-determining the S11 parameter for the forward and reflected RF signals in the transmission path from the RF source. Note that in embodiments, the sequence in which steps 1006 and 1010 and 1012 and 1014 may be reversed, so that the signal power ratio is measured and mitigated before the phase angle. Such an implementation, however, may be relatively inefficient as it could cause relatively high-power signals to be generated during such a recalibration sequence.

In step 1014, the controller may be configured to determine whether the match is the "best" match available match given the range of values of variable inductance network 410. A "best" match may be determined, for example, by iteratively measuring the forward and reflected RF power for all possible configuration of variable impedance network 410, and determining which configuration results in the lowest reflected-to-forward power ratio.

While the inductance of variable inductance network 410 is adjusted during the execution of step 1014, the other variable inductance networks within variable impedance matching network 400 may be unchanged (i.e., held at a consistent inductance value) so that only the inductance of variable inductance network 410 is modified. Because only a single variable inductance network is being modified, only available inductance states of that single variable inductance network must be changed, rendering step 1014 more efficient than if step 1014 called for testing all potential states of all variable inductance networks in variable impedance matching network 400 in this step.

Following the completion of step 1014, the impedance of variable impedance matching network 400 has been optimized so that the match provided by variable impedance matching network 400 is acceptable. The method then moves to step 1008 and ends. At this point, if the method of FIG. 10 is being executed as part of step 910 of the method of FIG. 9, the method of FIG. 9 would move on to step 920 and the high power signal would be supplied through the now optimized variable impedance matching network to deliver energy into the heating system's load.

Generally, during the execution of the method of FIG. 10, the controller adjusts the configuration of variable inductance networks 410 and 411 in steps 1010 and 1014 by sending control signals to variable impedance matching network 410, which cause variable impedance matching network 410 to increase and/or decrease the variable inductances within the network (e.g., by causing the variable inductance networks 410, 411 to have different inductance states).

An embodiment of a system includes a radio frequency (RF) signal source configured to supply an RF signal, and an impedance matching network electrically coupled to an output of the RF signal source. The impedance matching network includes a first variable inductance network, and a second variable inductance network. The system includes a transmission path electrically coupled between the impedance matching network and an electrode. The RF signal generates a forward signal along the transmission path. The system includes power detection circuitry configured to determine a phase angle between the forward signal and a reflected signal along the transmission path and a controller. The controller is configured to determine that the phase angle between the forward signal and the reflected signal is greater than a threshold phase angle value, modify, based on the phase angle between the forward signal and the reflected signal, the first variable inductance network to modify a series inductance of the impedance matching network to reduce the phase angle between the forward signal and the reflected signal to a first phase angle that is less than the threshold phase angle value, determine that a ratio of a power of the reflected signal to a power of the forward signal is greater than a threshold power ratio, and, after modifying the series inductance of the impedance matching network, modify the second variable inductance network to modify a shunt inductance of the impedance matching network to reduce the ratio of a power of the reflected signal to a power of the forward signal to a first power ratio that is less than the threshold power ratio.

An embodiment of a system includes a radio frequency (RF) signal source configured to supply an RF signal to an electrode through a transmission path. The transmission path includes a fixed-value inductor with a fixed inductance value. The fixed-value inductor has a first terminal and a second terminal. The system includes a first variable inductance network coupled between the second terminal of the fixed-value inductor and a ground reference node and a second variable inductance network coupled between the first terminal of the fixed-value inductor and the ground reference node. The first terminal of the fixed-value inductor is coupled to an output terminal of the RF signal source. The system includes a controller configured to determine a phase angle between a forward signal and a reflected signal along the transmission path, modify, based on the phase angle between the forward signal and the reflected signal, the first variable inductance network to improve an impedance match between the RF signal source and the electrode, and, after modifying the first variable inductance network, determine a ratio of a power of the reflected signal to a power of the forward signal, and modify an inductance of the second variable inductance network to reduce the ratio of a power of the reflected signal to a power of the forward signal.

An embodiment of a method includes providing, by a radio frequency (RF) signal source through a transmission path connected to an impedance matching network, an RF signal to an electrode that is proximate to a cavity. The impedance matching network includes a first variable component and a second variable component. The method includes determining a phase angle between a forward signal and a reflected signal along the transmission path, modifying, based on the phase angle between the forward signal and the reflected signal, the first variable component to improve an impedance match between the RF signal source and the electrode, and, after modifying the first variable component determining a ratio of a power of the reflected signal to a power of the forward signal, and modifying an inductance of the second variable component to reduce the ratio of a power of the reflected signal to a power of the forward signal.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:
1. A method comprising:
 generating, by a radio frequency (RF) signal source, a forward signal along a transmission path electrically coupled between the RF signal source and an electrode;
 performing impedance matching by an impedance matching network electrically coupled to an output of the RF signal source, wherein the impedance matching network is an inductor-only network that does not include capacitors, and the impedance matching network includes:
  a series inductance coupled along the transmission path, wherein the series inductance includes a first terminal coupled to the RF signal source, and a second terminal coupled to an electrode,
a first shunt inductive network directly connected to the second terminal of the series inductance, wherein the first shunt inductive network includes a first variable inductance network coupled between the second terminal of the series inductance and a ground reference, and
a second shunt inductive network directly connected to the first terminal of the series inductance, wherein the second shunt inductive network includes a second variable inductance network coupled between the first terminal of the series inductance and the ground reference;
determining, by power detection circuitry, a phase angle between the forward signal and a reflected signal along the transmission path;
causing, by a controller, the RF signal source to supply the forward signal at a relatively low power level;
while the RF signal source is supplying the forward signal at the relatively low power level, determining, by the controller, that the phase angle between the forward signal and the reflected signal is greater than a threshold phase angle value;
modifying, by the controller, based on the phase angle between the forward signal and the reflected signal, the first variable inductance network to reduce the phase angle between the forward signal and the reflected signal to a first phase angle that is less than the threshold phase angle value;
while the RF signal source is supplying the forward signal at the relatively low power level, determining, by the controller, that a ratio of a power of the reflected signal to a power of the forward signal is greater than a threshold power ratio;
modifying, by the controller, the second variable inductance network to reduce the ratio of the power of the reflected signal to the power of the forward signal to a first power ratio that is less than the threshold power ratio; and
after modifying the first and second variable inductance networks to reduce the phase angle between the forward signal and the reflected signal and to reduce the ratio of the power of the reflected signal to the power of the forward signal, causing, by the controller, the RF signal source to supply the forward signal at a relatively high power level.

2. The method of claim 1, further comprising:
causing, by the controller, the RF signal source to produce the RF signal with a power less than 100 Watts while modifying at least one of the first variable inductance network and the second variable inductance network.

3. The method of claim 2, further comprising:
after modifying at least one of the first variable inductance network and the second variable inductance network, the controller causing the RF signal source to increase a power of the RF signal to output a second RF signal having a power greater than 1,000 Watts.

4. The method of claim 1, wherein the impedance matching network further comprises:
a plurality of fixed-value inductors with fixed inductance values coupled to the electrode.

5. The method of claim 1, wherein the threshold phase angle value is less than 5 degrees.

6. The method of claim 1, wherein the threshold power ratio is less than −15 decibels.

7. The method of claim 1, further comprising:
repeatedly determining, by the controller, the phase angle between the forward signal and the reflected signal along the transmission path; and
repeatedly modifying, by the controller, based on the phase angle between the forward signal and the reflected signal, the first variable inductance network to improve an impedance match between the RF signal source and the electrode.

8. The method of claim 1, wherein the first shunt inductive network further includes a fixed-value inductor with a first terminal directly connected to the second terminal of the series inductance, and a second terminal directly connected to the first variable inductance network.

9. A method comprising:
providing, by a radio frequency (RF) signal source, an RF signal along a transmission path electrically coupled between the RF signal source and an electrode;
performing impedance matching by an impedance matching network electrically coupled between the RF signal source and the electrode, wherein the impedance matching network is an inductor-only network that does not include capacitors, and the impedance matching network includes:
a first fixed-value inductor with a fixed inductance value, the first fixed-value inductor having a first terminal and a second terminal, wherein the first terminal of the first fixed-value inductor is coupled to the RF signal source, and the second terminal of the first fixed-value inductor is coupled to the electrode,
a first shunt inductive network directly connected to the second terminal of the first fixed-value inductor, wherein the first shunt inductive network includes a first variable inductance network coupled between the second terminal of the first fixed-value inductor and a ground reference node, and
a second shunt inductive network directly connected to the first terminal of the first fixed-value inductor, wherein the second shunt inductive network includes a second variable inductance network coupled between the first terminal of the first fixed-value inductor and the ground reference node;
causing, by a controller, the RF signal source to supply the RF signal at a relatively low power level;
while the RF signal source is supplying the forward signal at the relatively low power level, determining, by the controller, a phase angle between a forward signal and a reflected signal along the transmission path;
modifying, by the controller, based on the phase angle between the forward signal and the reflected signal, the first variable inductance network to improve an impedance match between the RF signal source and the electrode;
after modifying the first variable inductance network, determining, by the controller, a ratio of a power of the reflected signal to a power of the forward signal;
after modifying the first variable inductance network, modifying, by the controller, an inductance of the second variable inductance network to reduce the ratio of the power of the reflected signal to the power of the forward signal; and
after modifying the first variable inductance network to reduce the ratio of the power of the reflected signal to the power of the forward signal, the controller causing the RF signal source to supply the forward signal at a relatively high power level.

10. The method of claim 9, wherein the controller causes the RF signal source to produce the RF signal with a power less than 100 Watts while modifying at least one of the first variable inductance network and the second variable inductance network.

11. The method of claim 10, wherein the controller, after modifying at least one of the first variable inductance network and the second variable inductance network, causes the RF signal source to increase a power of the RF signal to output a second RF signal having a power greater than 1,000 Watts.

12. The method of claim 9, further comprising:
repeatedly determining, by the controller, the phase angle between the forward signal and the reflected signal along the transmission path; and
repeatedly modifying, by the controller, based on the phase angle between the forward signal and the reflected signal, the first variable inductance network to improve an impedance match between the RF signal source and the electrode.

13. The method of claim 9, wherein the controller modifies the first variable inductance network by:

determining a difference between the phase angle and a target phase angle; and
modifying an inductance of the first variable inductance network to reduce the difference between the phase angle and the target phase angle.

14. The method of claim 9, wherein the first variable inductance network further comprises a plurality of fixed-value inductors with fixed inductance values coupled to the electrode.

15. The method of claim 9, wherein the electrode is disposed in a cavity of a system that is configured to contain a load.

16. The method of claim 9, wherein the first shunt inductive network further includes a second fixed-value inductor with a first terminal directly connected to the second terminal of the first fixed-value inductor, and a second terminal directly connected to the first variable inductance network.

* * * * *